(12) United States Patent
An

(10) Patent No.: US 10,510,923 B2
(45) Date of Patent: Dec. 17, 2019

(54) DISPLAY DEVICE AND METHOD OF MANUFACTURING THE SAME

(71) Applicant: LG Display Co., Ltd., Seoul (KR)

(72) Inventor: ChungHwan An, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/004,623

(22) Filed: Jun. 11, 2018

(65) Prior Publication Data

US 2019/0157501 A1 May 23, 2019

(30) Foreign Application Priority Data

Nov. 20, 2017 (KR) ........................ 10-2017-0155086

(51) Int. Cl.
*H01L 33/00* (2010.01)
*H01L 25/075* (2006.01)
(Continued)

(52) U.S. Cl.
CPC ...... *H01L 33/0079* (2013.01); *H01L 21/6835* (2013.01); *H01L 23/544* (2013.01); *H01L 25/0753* (2013.01); H01L 24/97 (2013.01); H01L 2221/68368 (2013.01); H01L 2223/54426 (2013.01); H01L 2223/54486 (2013.01); H01L 2224/83132 (2013.01);
(Continued)

(58) Field of Classification Search
CPC ............... H01L 21/6835; H01L 23/544; H01L 25/0753; H01L 33/0079; H01L 2221/68368; H01L 2223/54426; H01L 2223/54486
See application file for complete search history.

(56) References Cited

U.S. PATENT DOCUMENTS 6,600,180 B1 7/2003 Ueno et al.
8,349,116 B1 1/2013 Bibl et al.
(Continued)

FOREIGN PATENT DOCUMENTS

EP 2 455 652 A1 5/2012
JP 2001-203169 A 7/2001
(Continued)

OTHER PUBLICATIONS

Extended European Search Report issued in corresponding European Patent Application No. 18173472.4, dated Nov. 15, 2018.

*Primary Examiner* — Allan R Wilson
(74) *Attorney, Agent, or Firm* — Morgan, Lewis & Bockius LLP

(57) ABSTRACT

Disclosed are a display device and a method of manufacturing a display device. The method of a display device according to an exemplary embodiment of the present disclosure includes: a first transferring step of transferring a plurality of LEDs disposed on a wafer onto a plurality of donors; and a second transferring step of transferring the plurality of LEDs transferred onto the plurality of donors onto a display panel, in which in the second transferring step, an area where one of the plurality of donors overlaps the display panel partially overlaps an area where the other one of the plurality of donors overlaps the display panel. Therefore, the plurality of LEDs having different wavelengths is uniformly transferred to reduce a boundary caused by the difference in wavelengths and improve color uniformity.

15 Claims, 33 Drawing Sheets

(51) Int. Cl.
*H01L 21/683* (2006.01)
*H01L 23/544* (2006.01)
*H01L 23/00* (2006.01)

(52) U.S. Cl.
CPC .......... *H01L 2224/95001* (2013.01); *H01L 2224/95121* (2013.01); *H01L 2224/95136* (2013.01); *H01L 2924/12041* (2013.01)

(56) References Cited

U.S. PATENT DOCUMENTS

| | | | |
|---|---|---|---|
| 9,893,041 B2 * | 2/2018 | Pokhriyal | H01L 21/6835 |
| 10,177,123 B2 * | 1/2019 | Gardner | H01L 25/0753 |
| 2009/0168401 A1 | 7/2009 | Kwon et al. | |
| 2010/0258543 A1 * | 10/2010 | Mizuno | H01L 21/268 |
| | | | 219/121.72 |
| 2010/0259164 A1 | 10/2010 | Oohata et al. | |
| 2014/0186978 A1 | 7/2014 | Kang et al. | |
| 2014/0267683 A1 | 9/2014 | Bibl et al. | |
| 2017/0025399 A1 * | 1/2017 | Takeya | H01L 33/38 |
| 2017/0025484 A1 * | 1/2017 | Forrest | H01L 51/56 |
| 2017/0373046 A1 * | 12/2017 | Gardner | H01L 25/0753 |
| 2018/0096977 A1 * | 4/2018 | Ahmed | H01L 25/13 |
| 2018/0158806 A1 * | 6/2018 | Lai | H01L 25/0753 |
| 2018/0358246 A1 * | 12/2018 | Kobrin | H01L 21/67144 |

FOREIGN PATENT DOCUMENTS

| | | |
|---|---|---|
| JP | 2010-161221 A | 7/2010 |
| KR | 10-2000-0047584 A | 7/2000 |
| KR | 10-2014-0088408 A | 7/2014 |
| WO | 2017/008253 A1 | 1/2017 |

* cited by examiner

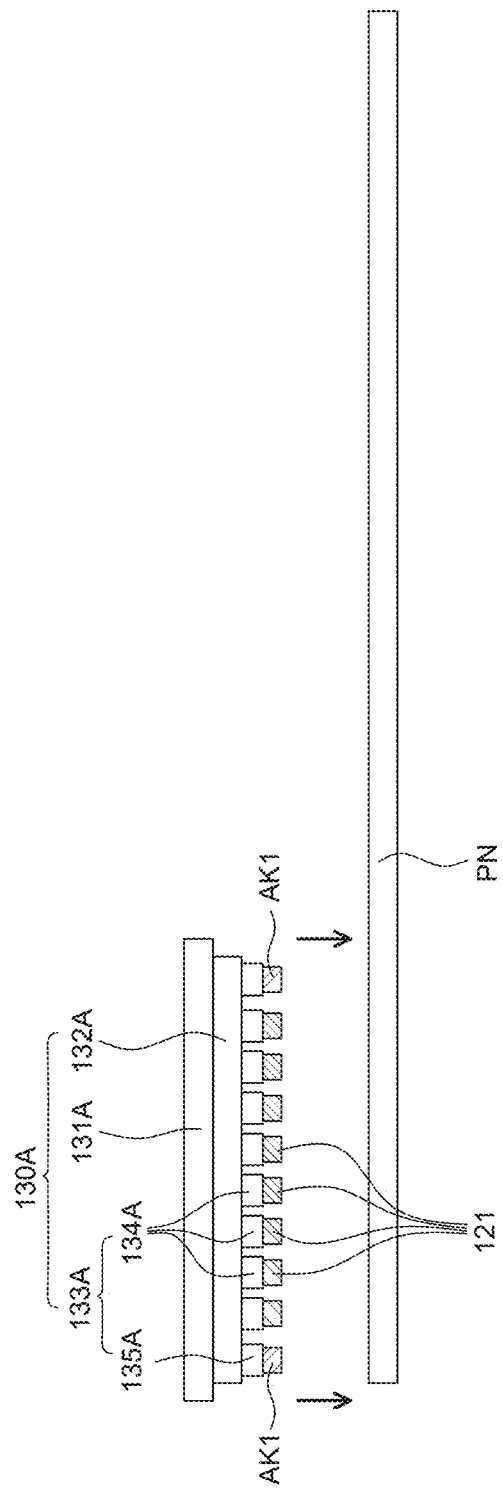

DISPLAY DEVICE AND METHOD OF MANUFACTURING THE SAME

CROSS-REFERENCE TO RELATED APPLICATIONS

This application claims the priority of Korean Patent Application No. 10-2017-0155086 filed on Nov. 20, 2017, in the Korean Intellectual Property Office, the disclosure of which is incorporated herein by reference.

BACKGROUND

Technical Field

The present disclosure relates to a display device and a method of manufacturing the same, and more particularly, to a display device using a light emitting diode (LED) with an improved light uniformity and a method of manufacturing the same.

Description of the Related Art

An applicable range of the liquid crystal display device (LCD) and the organic light emitting display device (OLED) which have been widely used until now is gradually expanded.

Due to advantages of the liquid crystal display device and the organic light emitting display device such as a high resolution screen, a small thickness, and light-weight, the liquid crystal display device and the organic light emitting display device are widely applied to screens of everyday electronic devices such as mobile phones or notebooks and the application range thereof is gradually expanded.

However, the liquid crystal display device and the organic light emitting display device have a limitation in reducing a size of a bezel area which is visibly recognized by a user as an area in which an image is not displayed. For example, in the case of the liquid crystal display device, a sealant needs to be used to seal the liquid crystal and bond an upper substrate and a lower substrate. Thus, there is a limitation in reducing the size of the bezel area. Further, in the case of the organic light emitting display device, an organic light emitting element which is formed of an organic material is vulnerable to moisture or oxygen so that an encapsulating unit needs to be disposed to protect the organic light emitting element. Therefore, there is a limitation in reducing the size of the bezel area. Specifically, it is difficult to implement a very large screen by one panel. Therefore, when the very large screen is implemented by disposing a plurality of liquid crystal display panels or a plurality of organic light emitting display panels in the form of tiles, bezel areas between adjacent panels may be visibly recognized by the user.

A display device including an LED has been suggested as an alternative to this. Since the LED is formed of an inorganic material, rather than an organic material, reliability is excellent so that a lifespan thereof is longer than the liquid crystal display device or the organic light emitting display device. Further, the LED is suitable for a very large screen because it has a fast lighting speed, low power consumption, and excellent stability due to high impact resistance and displays an image having high luminance.

In order to manufacture a display device including such an LED, a process of growing an LED on a wafer, transferring the LED on the wafer onto a donor, and then transferring the LED which is transferred onto the donor onto a substrate of a display device is used.

SUMMARY

In order to manufacture an LED, a plurality of LEDs which emits light of the same color is grown on one wafer. The LED which has been completely grown on the wafer is primarily transferred onto a donor and then secondarily transferred from the donor onto a display panel so that the LEDs are disposed on the display panel.

However, in a plurality of LEDs which is grown on one wafer to emit light of the same color, wavelengths of light actually emitted from individual LEDs are slightly different due to a process error. However, the human eye can perceive a small amount of difference of the wavelengths of light, for example, even though there is just a difference of 2 nm, the human eye can perceive the difference. Therefore, when the LED is transferred from the wafer onto the donor, and from the donor onto the display panel by one to one, uneven color due to the difference of wavelengths of light emitted from the LEDs may be undesirably perceived by viewers.

The inventors of the present disclosure recognized that the wavelengths of light of a plurality of LEDs which is grown on one wafer to emit light of the same color as described above are slightly different due to a process error. Therefore, the inventors of the present disclosure invented a display device with a new structure in which color uniformity is improved regardless of the process error occurring during the growth of the LEDs and a new method of manufacturing a display device.

Accordingly, embodiments of the present disclosure are directed to a display device and a method of manufacturing the same that substantially obviate one or more of the problems due to limitations and disadvantages of the related art.

An object of the present disclosure is to provide a display device with an improved color uniformity and a method of manufacturing a display device.

Another object of the present disclosure is to provide a display device which reduces a manufacturing cost by improving an allowable range of a wavelength difference of a plurality of LEDs grown on the wafer and a manufacturing method thereof.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a method of manufacturing a display device comprises a first transferring step of transferring a plurality of LEDs disposed on a wafer onto a plurality of donors and a second transferring step of transferring the plurality of LEDs transferred onto the plurality of donors onto a display panel, in which in the second transferring step, an area where one of the plurality of donors overlaps the display panel partially overlaps an area where the other one of the plurality of donors overlaps the display panel. Accordingly, a plurality of LEDs which is grown on one wafer but has uneven wavelength distribution due to a process error is uniformly transferred onto the display panel, so that wavelength difference between the plurality of LEDs due to the uneven wavelength distribution may be lowered and the color uniformity may be improved.

In another aspect, a method of manufacturing a display device comprises transferring some of a plurality of LEDs disposed on a first wafer onto a first donor, transferring the other of the plurality of LEDs disposed in the first wafer or some of a plurality of LEDs disposed on a second wafer onto a second donor, transferring the plurality of LEDs transferred onto the first donor in a first area of a display panel, and transferring the plurality of LEDs transferred onto the second donor in a second area of the display panel, in which the first area and the second area at least partially overlap each other to improve color uniformity between the plurality of LEDs. Accordingly, the color uniformity may be improved and a manufacturing cost may be reduced.

In another aspect of the present disclosure, a display device comprises a display panel which includes a plurality of sub-pixels disposed in a plurality of rows and a plurality of columns and a plurality of first LEDs and a plurality of second LEDs disposed in the plurality of sub-pixels in which the plurality of first LEDs and the plurality of second LEDs are alternately disposed in a row direction or a column direction. Accordingly, the plurality of first LEDs and the plurality of second LEDs are alternately disposed so that the color uniformity may also be improved.

Other detailed matters of the embodiments are included in the detailed description and the drawings.

According to the present disclosure, color uniformity between a plurality of LEDs with uneven wavelength distribution may be improved.

According to the present disclosure, even though there may be a difference in wavelengths of light emitted from a plurality of LEDs grown on one wafer, the plurality of LEDs is transferred to minimize the wavelength difference between the plurality of LEDs, thereby improving color uniformity.

The effects according to the present disclosure are not limited to the contents exemplified above, and more various effects are included in the present disclosure.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings:

FIGS. 2A to 2J are schematic views of processes for explaining a display device and a method of manufacturing a display device according to an exemplary embodiment of the present disclosure;

DETAILED DESCRIPTION

Figure 1:
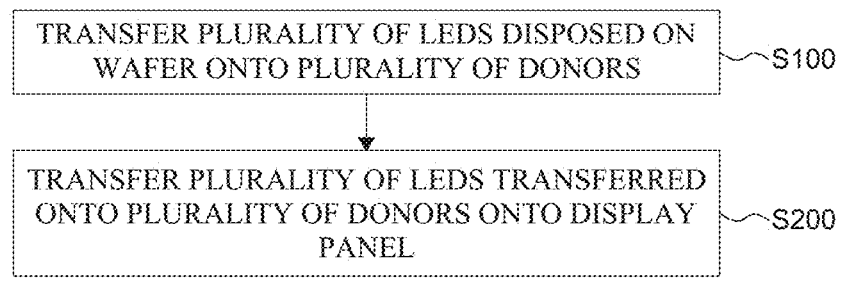
FIG. 1 is a flowchart for explaining a display device and a method of manufacturing a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to embodiments disclosed herein but will be implemented in various forms. The embodiments are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for the convenience of description, and the present disclosure is not limited to the size and the thickness of the component illustrated.

The features of various embodiments of the present disclosure can be partially or entirely bonded to or combined with each other and can be interlocked and operated in technically various ways, and the embodiments can be carried out independently of or in association with each other.

Hereinafter, the present disclosure will be described in detail with reference to the drawings.

Figure 2A:
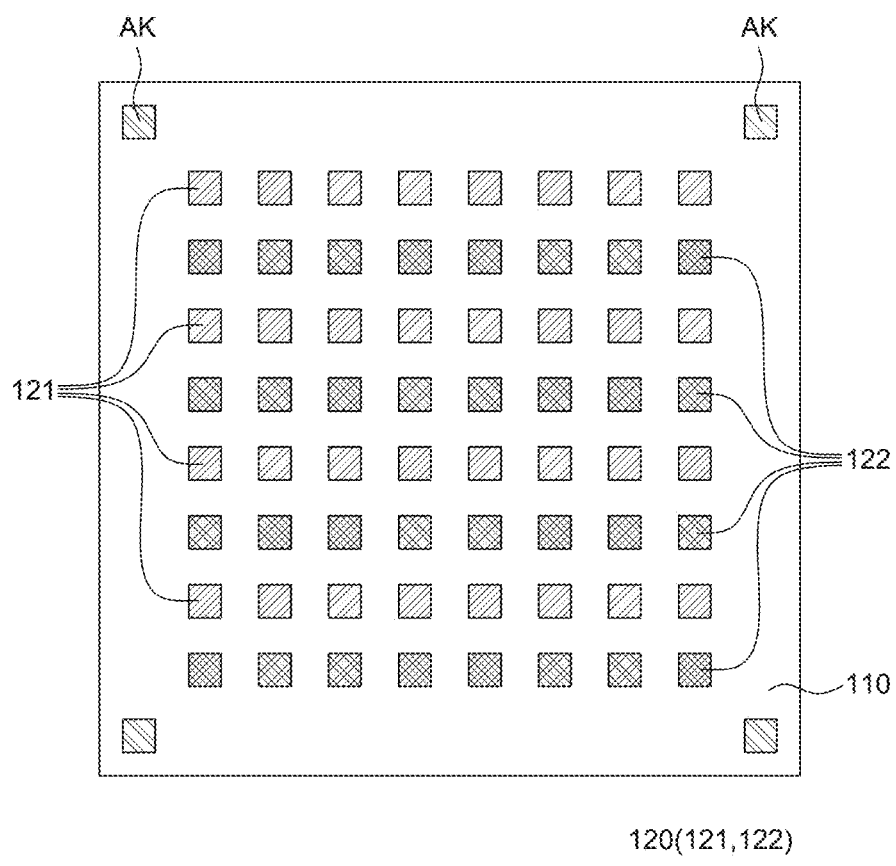
Figure 2B:
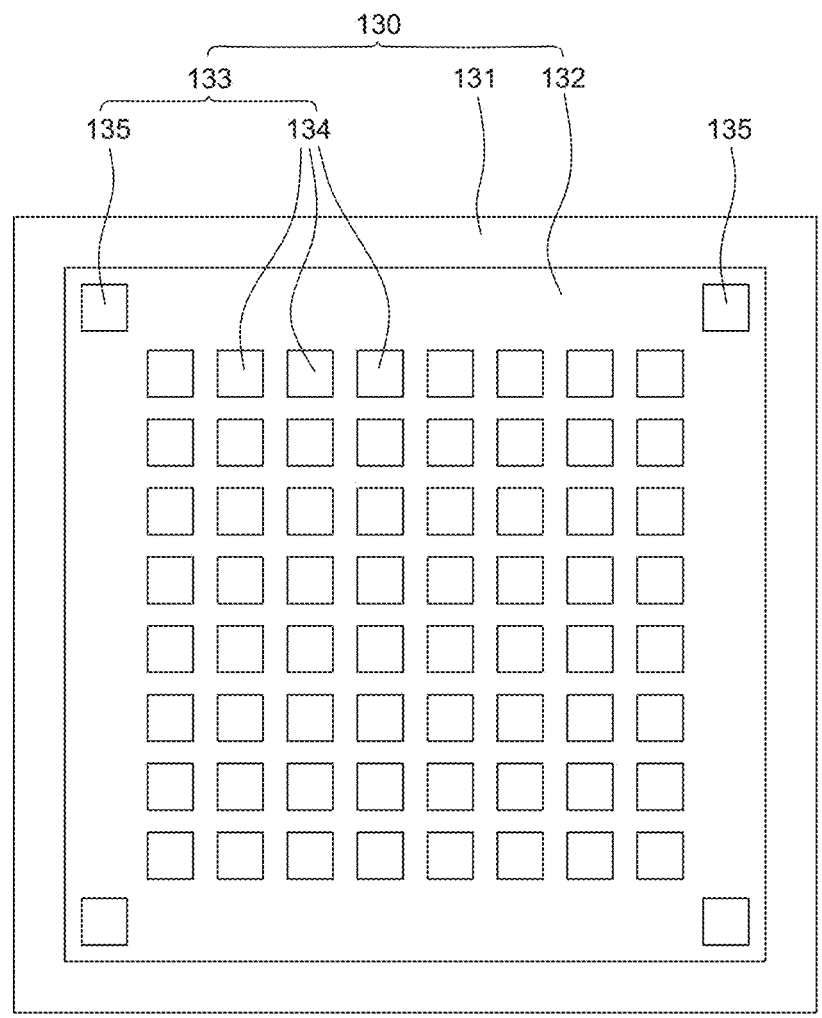
Figure 2C:
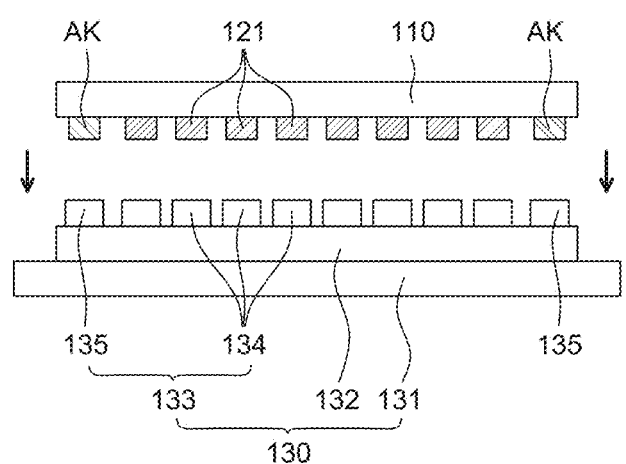
Figure 2D:
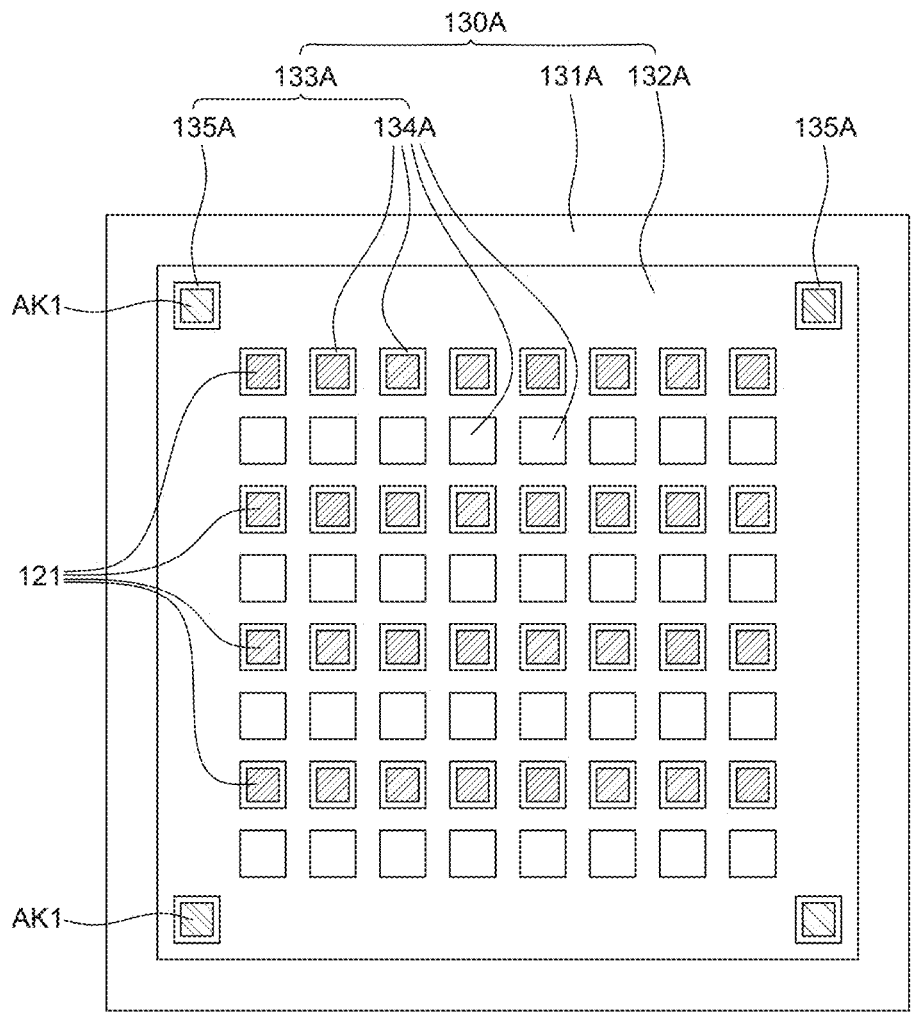
Figure 2E:
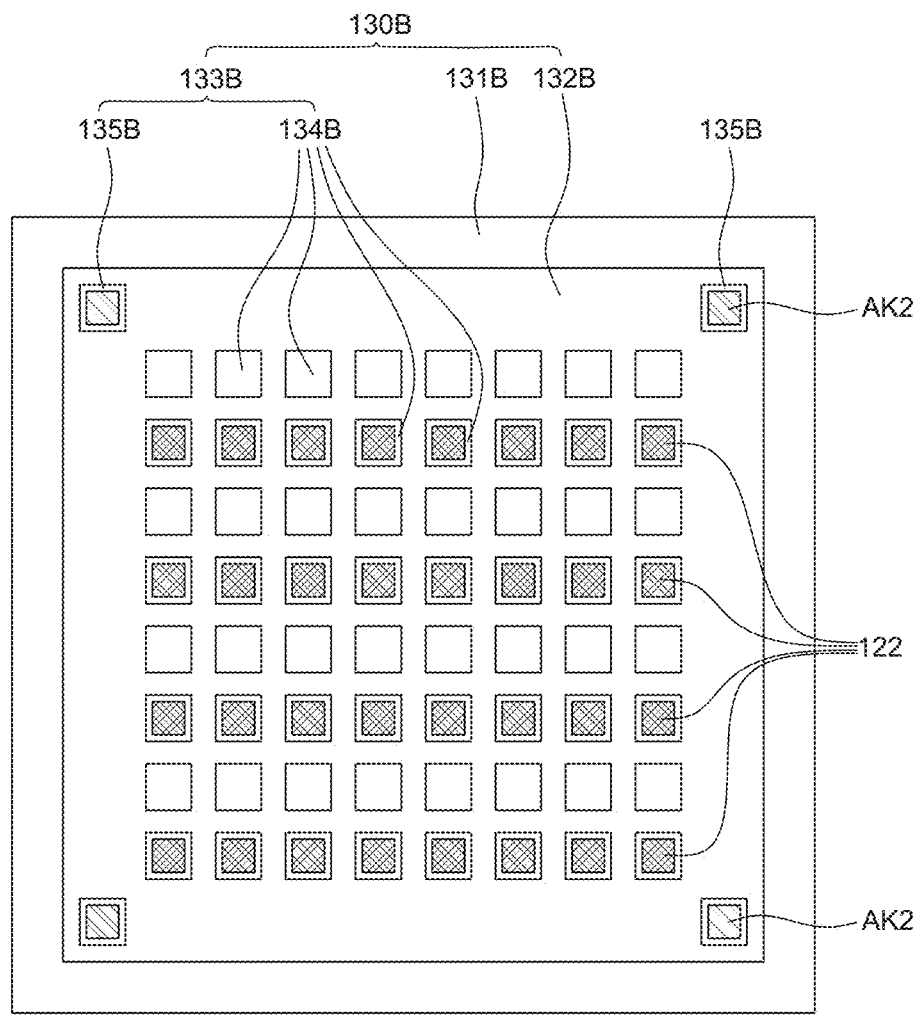
Figure 2F:
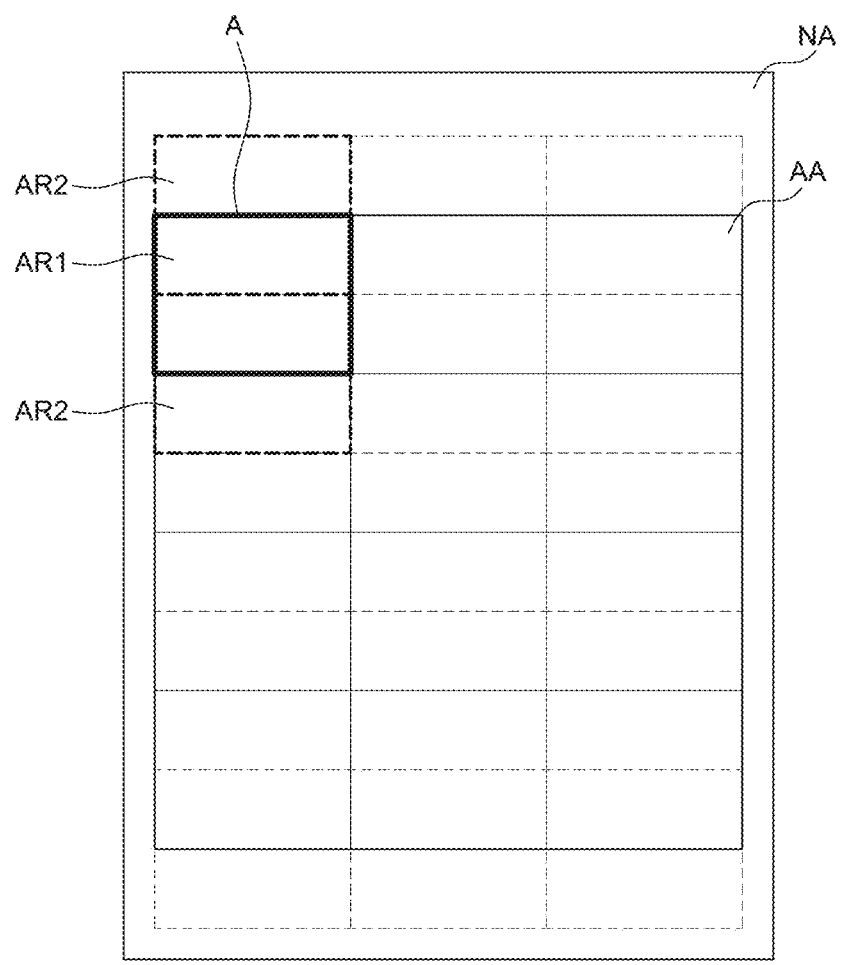
Figure 2H:
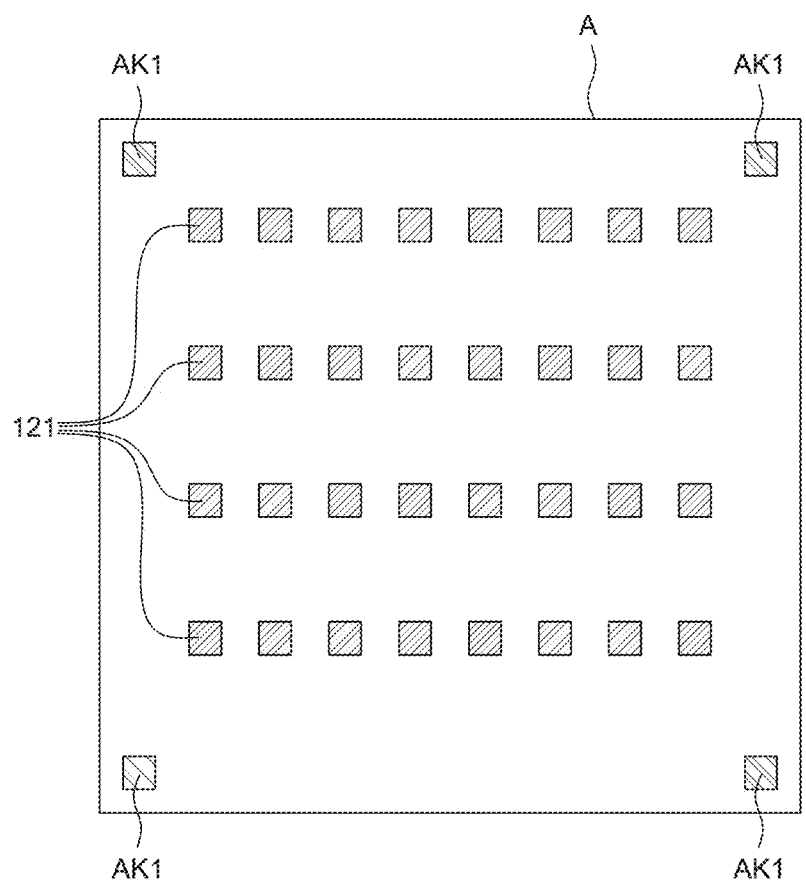
Figure 2I:
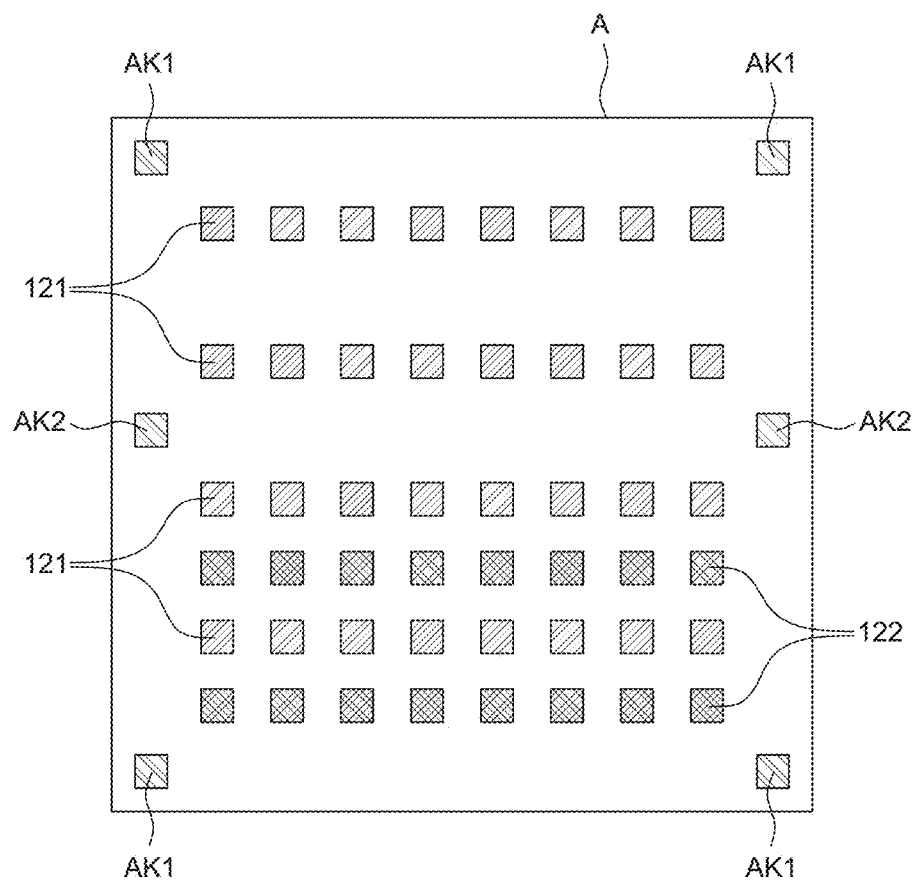
Figure 2J:
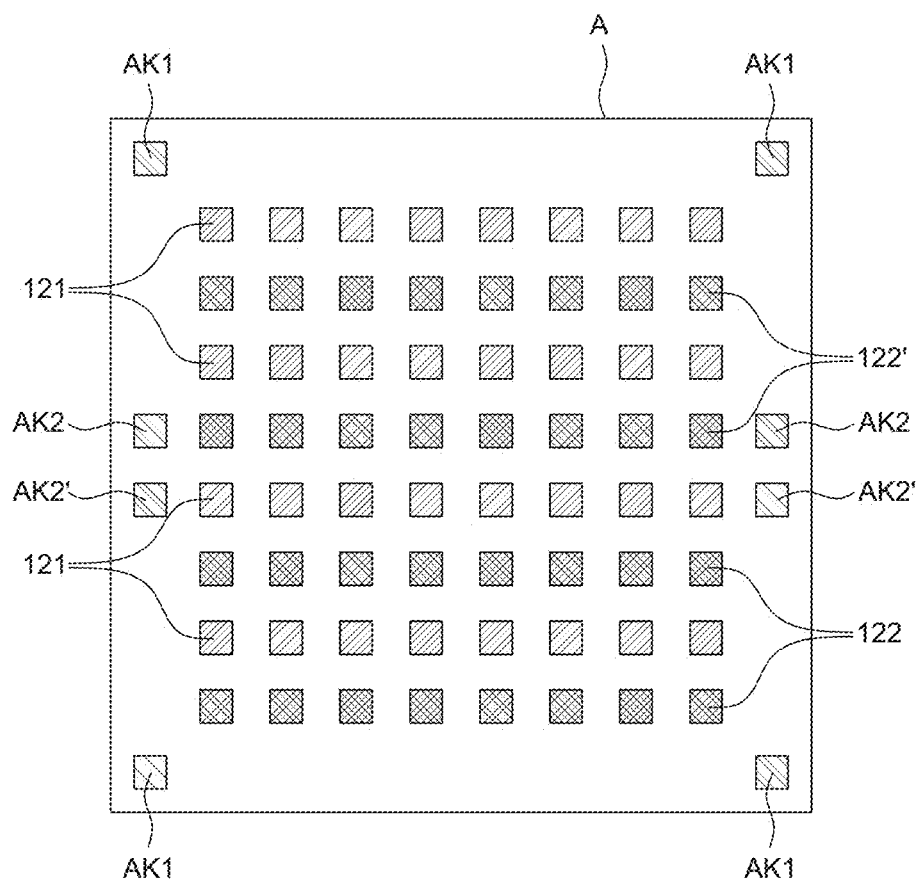

FIG. 1 is a flowchart for explaining a display device and a method of manufacturing a display device according to an exemplary embodiment of the present disclosure. FIGS. 2A to 2J are schematic views of processes for explaining a display device and a method of manufacturing a display device according to an exemplary embodiment of the present disclosure. Specifically, FIG. 2A is a plan view of a wafer on which a plurality of LEDs is disposed. FIG. 2B is a plan view of a donor before the plurality of LEDs is transferred. FIG. 2C is a schematic cross-sectional view for explaining a process of transferring a plurality of LEDs disposed on a wafer onto a donor. FIG. 2D is a plan view of a first donor onto which the plurality of LEDs is completely transferred. FIG. 2E is a plan view of a second donor onto which the plurality of LEDs is completely transferred. FIG. 2F is a plan view of a display panel. FIG. 2G is a schematic cross-sectional view for explaining a process of transferring a plurality of LEDs disposed on a donor onto a display panel. FIGS. 2H to 2J are enlarged plan views of an A area of a display panel for explaining a process of transferring a plurality of LEDs of a donor onto a display panel.

First, referring to FIG. 2A, a plurality of LEDs 120 is grown on a wafer 110.

The wafer 110 is a substrate on which the LEDs 120 are formed. The LED 120 may be formed by depositing a material such as GaN or InGaN which configures the LED 120 on the wafer 110 to grow a crystal layer, cutting the crystal layer into individual chips and forming an electrode. The wafer 110 may be formed of sapphire, SiC, GaN, ZnO, or the like but is not limited thereto.

A plurality of LEDs 120 which emits light of the same color is formed on one wafer 110. That is, a plurality of LEDs 120 which emits light of the same color may be formed on each of a plurality of wafers 110, respectively.

In some exemplary embodiments, a plurality of LEDs 120 which emits light of the different colors may be formed on one wafer 110. For example, LEDs which emit red light, LEDs which emit green light, and LEDs which emit blue light may be formed on one wafer 110. Hereinafter, for the convenience of description, it is assumed that a plurality of LEDs 120 which emits light of the same color is formed on one wafer 110, but is not limited thereto.

The LED 120 is a semiconductor device which emits light at the time of applying a voltage. The LEDs 120 emit red light, green light, and blue light and light of various colors including white is implemented by combination thereof.

In the meantime, the plurality of LEDs 120 includes a plurality of first LEDs 121 and a plurality of second LEDs 122. The plurality of first LEDs 121 and the plurality of second LEDs 122 are disposed in different rows on the wafer 110. For example, the plurality of first LEDs 121 may be disposed on odd-numbered rows and the plurality of second LEDs 122 may be disposed on even-numbered rows. In FIG. 2A, even though the plurality of first LEDs 121 and the plurality of second LEDs 122 are hatched in different ways, this is for the convenience of description. Actually, the plurality of first LEDs 121 and the plurality of second LEDs 122 may emit light of the same color.

In the meantime, the plurality of LEDs 120 may be formed by various structures such as a lateral structure, vertical structure, or a flip chip structure.

A lateral LED includes a light emitting layer and an N-type electrode and a P-type electrode which are horizontally disposed on both sides of the light emitting layer. The lateral LED emits light by coupling electrons supplied to the light emitting layer through the N-type electrode and holes supplied to the light emitting layer through the P-type electrode.

A vertical LED includes a light emitting layer and an N-type electrode and a P-type electrode which are disposed above and below the light emitting layer, respectively. Similarly to the lateral LED, the vertical LED also emits light by coupling the electrons and holes supplied from the electrodes.

A flip-chip LED has the substantially same structure as the lateral LED. However, the flip chip LED may directly bond an electrode to a printed circuit board by omitting a medium such as a metal wire.

According to the structure of the LED 120, a transferring method may vary to directly transfer the LED from the wafer 110 to the display panel PN or transfer the LED from the wafer 110 to the display panel PN via the donor 130. For example, the lateral LED may undergo a first transferring process from the wafer 110 to the donor 130 and a second transferring process from the donor 130 to the display panel PN. Hereinafter, for the convenience of description, it is assumed that the LED 120 has a lateral structure, but is not limited thereto.

A plurality of alignment keys AK is disposed on the wafer 110. The alignment key AK is a mark for adjusting alignment and parallelism between the wafer 110 and the donor 130 when the plurality of LEDs 120 of the wafer 110 is transferred onto the donor 130. The alignment key AK may not be disposed between the plurality of LEDs 120, but may be disposed to be close to the corner of the wafer 110 at an outer periphery of the plurality of LEDs 120. However, the alignment key AK may be disposed in other position than the corner of the wafer 110 depending on a design and the number of alignment keys AK may be determined in various ways.

When the plurality of LEDs 120 of the wafer 110 is transferred onto the donor 130, the alignment key AK may be transferred together with the plurality of LEDs 120 or may not be transferred. When the alignment key AK is transferred onto the donor 130 together with the plurality of LEDs 120, a process for aligning the alignment key AK of the donor 130 and the alignment key AK of the wafer 110 may be simplified.

Referring to FIG. 2B, the donor 130 is a medium for transferring the LED 120 of the wafer 110 onto the display panel PN. A size of the donor 130 may be similar to a size of the wafer 110 and the plurality of LEDs 120 may be transferred from the wafer 110 onto the donor 130 by a laser transferring method. For example, the donor 130 is directly bonded to the wafer 110 and then the LED 120 is separated from the wafer 110 through a laser lift off (LLO) process to transfer the LED 120 onto the donor 130.

The donor 130 includes a base layer 131, an adhering layer 132, and a plurality of bumps 133.

The base layer 131 is a substrate which supports the adhering layer 132 and the plurality of bumps 133. The base layer 131 may be formed of a rigid material to suppress warpage of the adhering layer 132.

The adhering layer 132 is disposed on the base layer 131. On the adhering layer 132, a plurality of LEDs 120 transferred from the wafer 110 may be disposed. The adhering layer 132 may be configured by poly dimethyl siloxane (PDMS), poly urethane acrylate (PUA), polyethylene glycol (PEG), polymethylmethacrylate (PMMS), polystyrene (PS), epoxy resin, urethane resin, or acrylic resin, but is not limited thereto.

The plurality of 133 bumps 133 protrudes from the adhering layer 132 to be formed of the same material as the adhering layer 132. The plurality of LEDs 120 which is transferred from the wafer 110 onto the display panel PN may be transferred onto the plurality of bumps 133, respectively.

The donor 130 includes only the base layer 131 and the adhering layer 132 and the plurality of LEDs 120 may be directly transferred onto the adhering layer 132. That is, the donor 130 may not include a separate bump 133. A structure of the donor 130 may vary depending on a shape, an arrangement, and a transferring method of the plurality of LEDs 120, and is not limited thereto. Hereinafter, for the convenience of description, it is assumed that the donor 130 includes a plurality of bumps 133 and the plurality of LEDs 120 is transferred onto the plurality of bumps 133, respectively.

The plurality of bumps 133 includes a plurality of first bumps 134 onto which the LEDs 120 are adhered and a plurality of second bumps 135 onto which a plurality of alignment keys AK is adhered. As illustrated in FIG. 2B, the plurality of first bumps 134 may be disposed so as to correspond to the plurality of LEDs 120 disposed on the wafer 110 one to one. However, the plurality of first bumps 134 may be disposed so as to correspond to only some of LEDs 120 on the wafer 110 one to one. For example, the first bumps 134 may be disposed in odd-numbered rows on the adhering layer 132 so as to correspond to the plurality of first LEDs 121 on the wafer 110 or may be disposed in even-numbered rows on the adhering layer 132 so as to correspond to the plurality of second LEDs 122 on the wafer 110. The arrangement of the first bumps 134 may vary depending on a design, and is not limited thereto.

The plurality of second bumps 135 may be disposed so as to correspond to the plurality of alignment keys AK disposed on the wafer 110 one to one. When a separate alignment key is disposed in the plurality of second bumps 135, the plurality of alignment keys AK of the wafer 110 and the alignment key of the donor 130 are used to align the wafer 110 and the donor 130. However, when the plurality of LEDs 120 and the alignment keys AK are simultaneously transferred onto the donor 130 from the wafer 110, the alignment key AK may be transferred onto the plurality of second bumps 135 from the wafer 110. The arrangement of the second bumps 135 may vary depending on a design of the alignment key AK, and is not limited thereto.

In the meantime, a plurality of donors 130 may be configured. For example, a first donor 130A and a second donor 130B may be used. The plurality of first LEDs 121 of the wafer 110 may be transferred onto the first donor 130A and the plurality of second LEDs 122 may be transferred onto the second donor 130B.

Next, the plurality of LEDs 120 disposed on the wafer 110 is primarily transferred onto the plurality of donors 130 (S100).

Referring to FIG. 2C, the plurality of LEDs 120 of the wafer 110 is transferred onto the donor 130. Specifically, the wafer 110 is disposed on the donor 130 such that upper surfaces of the plurality of bumps 133 of the donor 130 are opposite to upper surfaces of the plurality of LEDs 120 of the wafer 110. Further, among the plurality of LEDs 120 of the wafer 110, laser is irradiated only onto LEDs 120 to be transferred onto the donor 130. The LED 120 onto which the laser is irradiated is separated from the wafer 110 to be adhered onto the plurality of bumps 133 of the donor 130. Thereafter, when the plurality of LEDs 120 is completely transferred, the donor 130 and the wafer 110 may be separated.

However, in FIG. 2C, it is illustrated that when the plurality of LEDs 120 is primarily transferred from the wafer 110 onto the donor 130, a laser lift-off method is used. However, various transferring methods such as an anchor structure method may be used and are not limited thereto.

Referring to FIG. 2D, the plurality of first LEDs 121 among the plurality of LEDs 120 of the wafer 110 is transferred onto the first donor 130A.

Specifically, among the plurality of LEDs 120 disposed on the wafer 110, a plurality of LEDs 120 disposed in odd-numbered lines may be transferred onto the first donor 130A. Therefore, only the plurality of first LEDs 121 among the plurality of LEDs 120 disposed on the wafer 110 is transferred onto the first donor 130A so that the plurality of first LEDs 121 may be disposed only on the plurality of first bumps 134 disposed in odd-numbered rows among the plurality of first bumps 134 of the first donor 130A.

Further, the plurality of first alignment keys AK1 may be disposed on the plurality of second bumps 135 close to the corner of the first donor 130A. However, the first alignment key AK1 of the second bump 135 may be transferred from the wafer 110 or the first alignment key AK1 may be already disposed before transferring the plurality of first LEDs 121 onto the first donor 130A.

Referring to FIG. 2E, the plurality of second LEDs 122 among the plurality of LEDs 120 of the wafer 110 is transferred onto the second donor 130B. Among the plurality of LEDs 120 disposed on the wafer 110, the plurality of LEDs 120 which is disposed on even-numbered lines different from the lines transferred onto the first donor 130A may be transferred onto the second donor 130B. In FIGS. 2D and 2E, it is illustrated that the plurality of first LEDs 121 in the odd-numbered lines among the plurality of LEDs 120 is transferred onto the first donor 130A and the plurality of second LEDs 122 in the even-numbered lines among the plurality of LEDs 120 is transferred onto the second donor 130B. In contrast, the plurality of second LEDs 122 in the even-numbered lines among the plurality of LEDs 120 may be transferred onto the first donor 130A and the plurality of first LEDs 121 in the odd-numbered lines among the plurality of LEDs 120 may be transferred onto the second donor 130B.

Therefore, only the plurality of second LEDs 122 among the plurality of LEDs 120 disposed on the wafer 110 is transferred onto the second donor 130B so that the plurality of second LEDs 122 may be disposed only on the plurality of first bumps 134 disposed in even-numbered rows among the plurality of first bumps 134 of the second donor 130B.

Further, the plurality of second alignment keys AK2 may be disposed on the plurality of second bumps 135B close to the corner of the second donor 130B. However, the second alignment key AK2 of the second bump 135B may be transferred from the wafer 110 or the second alignment key AK2 may be already disposed before transferring the plurality of second LEDs 122 onto the second donor 130B.

Accordingly, the plurality of first LEDs 121 and second LEDs 121 grown on one wafer 110 may be separately transferred onto the first donor 130A and the second donor 130B, respectively.

In FIGS. 2C to 2E, even though it is described that one LED 120 is transferred onto one bump 133 of the donor 130, the first transferring may be performed to transfer the plurality of LEDs 120 on the one bump 133.

Next, after the plurality of LEDs 120 is completely transferred onto the plurality of donors 130, the plurality of LEDs 120 transferred onto the plurality of donors 130 is secondarily transferred onto the display panel PN (S200).

Referring to FIG. 2F, the display panel PN includes a display area AA and a non-display area NA.

The display panel PN is a panel in which an image is implemented. Display elements for implementing an image, circuits, wiring lines, and components for driving the display elements may be disposed in the display panel.

In the display area AA, a plurality of pixels is disposed and images are displayed. In the display area AA, the display elements for displaying images and circuit units for driving the display elements may be disposed. In this case, the display elements are LEDs 120 and a plurality of LEDs 120 which emits light of different colors is disposed in the plurality of pixels to implement images.

The circuit units may include various thin film transistors, capacitors, and wiring lines for driving the LEDs 120. For example, the circuit units may include various configurations such as a thin film transistor, a storage capacitor, a gate line, and a data line, but are not limited thereto.

In the non-display area NA, wiring lines and components for driving the display elements of the display area AA are disposed and the images are not displayed and circuits. In the non-display area NA, various ICs such as a gate driver IC and a data driver IC and driving circuits may be disposed.

In the meantime, in the case of the display panel PN using the plurality of LEDs 120, the plurality of display panels PN is disposed in a tile pattern to be suitable for implementing tiling display. Specifically, an interval between an outermost LED 120 of one display panel PN and an outermost LED 120 of another adjacent display panel PN may be implemented to be equal to the intervals of the plurality of LEDs 120 in one display panel PN. Therefore, the display panel PN may implement zero bezel in which a bezel area does not substantially exist so that a boundary between the display panels PN may not be perceived in the tiling display and the image may be clearly implemented. Accordingly, in the display device and the method of manufacturing a display device according to the exemplary embodiment of the present disclosure, the display panel PN may not include the non-display area NA and it may be defined that only the display area AA is disposed in the entire display panel PN. Further, various ICs such as a gate driver IC or a data driver IC and various components such as a driving circuit may be disposed on a rear side of the display panel PN.

The plurality of LEDs 120 is transferred in the plurality of first areas AR1 and the plurality of second areas AR2 of the display panel PN.

The first area AR1 is an area where the plurality of first LEDs 121 of the first donor 130A is transferred and a plurality of first areas AR1 may overlap the entire display area AA. Specifically, the plurality of first areas AR1 is disposed in a row direction and a column direction in the display area AA. For example, the A area A represented by a bold solid line in FIG. 2F is the same area as one first area AR1 among the plurality of first areas AR1.

The second area AR2 is an area where the plurality of second LEDs 122 of the second donor 130B is transferred and a plurality of second areas AR2 may overlap the entire display area AA and a part of the non-display area NA. Specifically, the plurality of second areas AR2 is disposed in the row direction and the column direction in the display area AA and the non-display area NA and the plurality of second areas AR2 may overlap the plurality of first areas AR1. For example, the second area AR2 is represented by a dotted line in FIG. 2F.

In the meantime, a first row in the plurality of first areas AR1 and a first row in the plurality of second areas AR2 may be different from each other even though they are the same first row. The first row in the plurality of second areas AR2 may be disposed more outwardly than the first row in the plurality of first areas AR1. Therefore, two opposite sides of the plurality of first areas AR1 and two opposite sides of the plurality of second areas AR2 extending in the column direction may overlap each other, but two opposite sides of the plurality of first areas AR1 and two opposite sides of the plurality of second areas AR2 extending in the row direction may not overlap each other. For example, referring to two second areas AR2 represented by a dotted line and the first areas AR1 represented by a bold solid-line in FIG. 2F, two sides among four sides of the first area AR1 and the second area AR2 extend in the column direction on the same line, but other two sides may extend in the row direction on different lines. Therefore, two second areas AR2 may overlap one first area AR1.

In this case, the plurality of second LEDs 122 is not actually transferred in a part of second area AR2 which does not overlap the display area AA. Therefore, the plurality of second LEDs 122 may be disposed only in a part of the area corresponding to the display AA in the second donor 130B. Alternatively, only the plurality of second LEDs 122 in an area corresponding to the display area AA among the plurality of second LEDs 122 disposed in the entire second donor 130B may be transferred onto the display panel PN.

Referring to FIG. 2G, the plurality of LEDs 120 of the donor 130 is transferred onto the display panel PN. For example, the first donor 130A is disposed on the display panel PN such that the upper surface of the plurality of first LEDs 121 of the first donor 130A is opposite to the first area AR1 of the display panel PN. The plurality of first LEDs 121 may be detached from the first donor 130A to be transferred in the first area AR1 of the display panel PN. In this case, the plurality of first alignment keys AK1 may also be selectively transferred onto the display panel PN together with the plurality of first LEDs 121 or not. Hereinafter, for the convenience of description, it is assumed that the plurality of alignment keys AK of the donor 130 is transferred onto the display panel PN together with the plurality of LEDs 120.

The A area A illustrated in FIGS. 2H to 2J is the same area as any one first area AR1 among the plurality of first areas AR1 as described above and may be defined as an area including two second areas AR2 overlapping the first area AR1.

First, referring to FIG. 2H, the plurality of first LEDs 121 and the plurality of alignment keys AK1 of the first donor 130A are transferred in the A area A which is the first area AR1 of the display panel PN. In this case, the plurality of LEDs 120 and the plurality of first alignment keys AK1 are transferred in the A area A as those are disposed in the first donor 130A. Therefore, the plurality of first LEDs 121 is disposed in the odd-numbered rows in the A area A and the plurality of first alignment keys AK1 is disposed to be close to the corner of the A area A.

Next, referring to FIG. 2I, the plurality of second LEDs 122 and second alignment keys AK2 of the second donor 130B are further transferred in a part of the A area A which is the second area AR2 of the display panel PN. In this case, the second area AR2 may overlap the A area A which is the first area AR1 by approximately ½. Specifically, the plurality of second LEDs 122 of the second donor 130B may be transferred in spaces between the plurality of first LEDs 121 disposed in a plurality of rows in the display panel PN. For example, the plurality of second LEDs 122 which is transferred from the second donor 130B onto the display panel PN may be disposed in a sixth row and an eighth row of the A area A of the display panel PN. The second alignment keys AK2 of the second donor 130B are spaced apart from the plurality of second LEDs 122 in the sixth row of the A area A with a predetermined interval to be disposed at an upper portion of the plurality of second LEDs 122 of the sixth row and both ends of a fourth row.

In this case, the corner of the first area AR1 and the corner of the second area AR2 do not overlap so that the first alignment key AK1 transferred in the first area AR1 does not overlap the second alignment key AK2 transferred in the second area AR2.

Referring to FIG. 2J, a plurality of second LEDs 122' and second alignment keys AK2' of the second donor 130B are transferred in another part of the A area A which is the second area AR2 of the display panel PN. In this case, the second donor 130B of FIG. 2J may be a donor in which a plurality of second LEDs 122' is disposed in a wafer different from that of the second donor 130B of FIG. 2I. For example, the plurality of second LEDs 122 is transferred from the first wafer onto the second donor 130B of FIG. 2I and the plurality of second LEDs 122' is transferred from the second wafer onto the second donor 130B of FIG. 2J. Therefore, the plurality of second LEDs 122 and 122' which emits light of the same color in the A area A may be grown on the same wafer 110 or may be grown on different wafers 110.

Specifically, the plurality of second LEDs 122' of the second donor 130B may be transferred in spaces between the plurality of first LEDs 121 disposed in a plurality of rows in the display panel PN in which the second LEDs 122 are not disposed. For example, the plurality of second LEDs 122' which is transferred from the second donor 130B onto the display panel PN may be disposed in a second row and a fourth row of the A area A of the display panel PN. The second alignment keys AK2' are spaced apart from the plurality of second LEDs 122 in the fourth row of the A area A with a predetermined interval to be disposed at a lower portion of the plurality of second LEDs 122 of the fourth row and both ends of a fifth row.

Therefore, the plurality of first LEDs 121 transferred from the first donor 130A and the plurality of second LEDs 122 and 122' transferred from the second donor 130B are alternately disposed in different rows. Further, the first alignment keys AK1 transferred from the first donor 130A may be disposed closely to the corner of the first area AR1 and the second alignment keys AK2 and AK2' transferred from the second donor 130B may be disposed between the first alignment keys AK1 of the first area AR1, respectively. In this case, the plurality of second LEDs 122 and 122' in the first area AR1 is transferred from different second donors 130B and emits light of the same color but may be grown on different wafers 110.

Further, after the plurality of first LEDs 121 and the plurality of second LEDs 122 and 122' which emit light of the same color are completely transferred onto the display panel PN, a plurality of LEDs which emits light of different colors from that of the plurality of LEDs 120 may be transferred between the plurality of LEDs 120 by the same way as described above. For example, when the plurality of first LEDs 121 and the plurality of second LEDs 122 and 122' emit red light, a process of transferring LEDs which emit blue light or green light may be performed.

Even though the plurality of LEDs grown on one wafer emits light of the same color, wavelengths of light which are actually emitted from the plurality of LEDs may be slightly different due to a process error. Accordingly, the color between the plurality of LEDs may not be uniform even in one wafer and the color between the plurality of LEDs grown on different wafers may not be uniform. In this case, when the plurality of LEDs of one wafer is transferred onto the display panel so as to correspond as it is, a wavelength deviation in the wafer is directly represented on the display panel so that color uniformity of the light may not be constant.

Therefore, in the display device and the method of manufacturing a display device according to the exemplary embodiment of the present disclosure, the plurality of LEDs 120 of one wafer 110 is not directly transferred onto the display panel PN, but may be transferred so as to be alternately disposed in the unit of rows. Specifically, the plurality of LEDs 120 grown on the same wafer 110 may be transferred onto the display panel PN so as to be alternately disposed in the unit of rows. For example, only the plurality of first LEDs 121 disposed in the odd-numbered rows in the wafer 110 is primarily transferred onto the first donor 130A and the plurality of first LEDs 121 of the first donor 130A may be secondarily transferred in the odd-numbered rows of the first area AR1 of the display panel PN. Further, only the plurality of second LEDs 122 disposed in the even-numbered rows in the wafer 110 is primarily transferred onto the second donor 130B and the plurality of second LEDs 122 of the second donor 130B may be secondarily transferred in the even-numbered rows of the second area AR2 of the display panel PN. Since the first area AR1 and the second area AR2 partially overlap, the plurality of second LEDs 122 may be disposed in some of the even-numbered rows of the first area AR1 and the even-numbered rows of the second area AR2. Accordingly, the plurality of first LEDs 121 and the plurality of second LEDs 122 grown on the same wafer 110 are alternately disposed in different rows so that the color uniformity in the display panel PN may be improved.

In some exemplary embodiments, a plurality of wafers 110 on which a plurality of LEDs 120 emitting light of the same color is disposed may be used for a first transferring process and a second transferring process. That is, some of the plurality of LEDs 120 disposed on the first wafer among the plurality of wafers 110 are transferred onto the first donor 130A and some of the plurality of LEDs 120 disposed on the second wafer among the plurality of wafers 110 are transferred onto the second donor 130B. In this case, some of the plurality of LEDs 120 disposed on the first wafer may be LEDs 120 which are disposed in odd-numbered rows or even-numbered rows, among the plurality of LEDs 120 disposed on the first wafer. Further, some of the plurality of LEDs 120 disposed on the second wafer among the plurality of wafers 110 may be LEDs 120 which are disposed in even-numbered rows or odd-numbered rows, among the plurality of LEDs 120 disposed on the second wafer. Thereafter, a transferring process onto the display panel PN may be performed such that the plurality of LEDs 120 which is grown on the first wafer and is transferred onto the first donor 130A is transferred in the first area AR1 of the display panel PN and the plurality of LEDs 120 which is grown on the second wafer and is transferred onto the second donor 130B is transferred in the second area AR2 of the display panel PN.

FIGS. 3A to 3G are schematic views of processes for explaining a display device and a method of manufacturing a display device according to another exemplary embodiment of the present disclosure. A display device and a method of manufacturing a display device illustrated in FIGS. 3A to 3G have the substantially same configuration as the display device and the method of manufacturing a display device of FIGS. 2A to 2J except that the arrangement of a plurality of LEDs 120 is different. Therefore, a redundant description will be omitted.

Figure 3A:
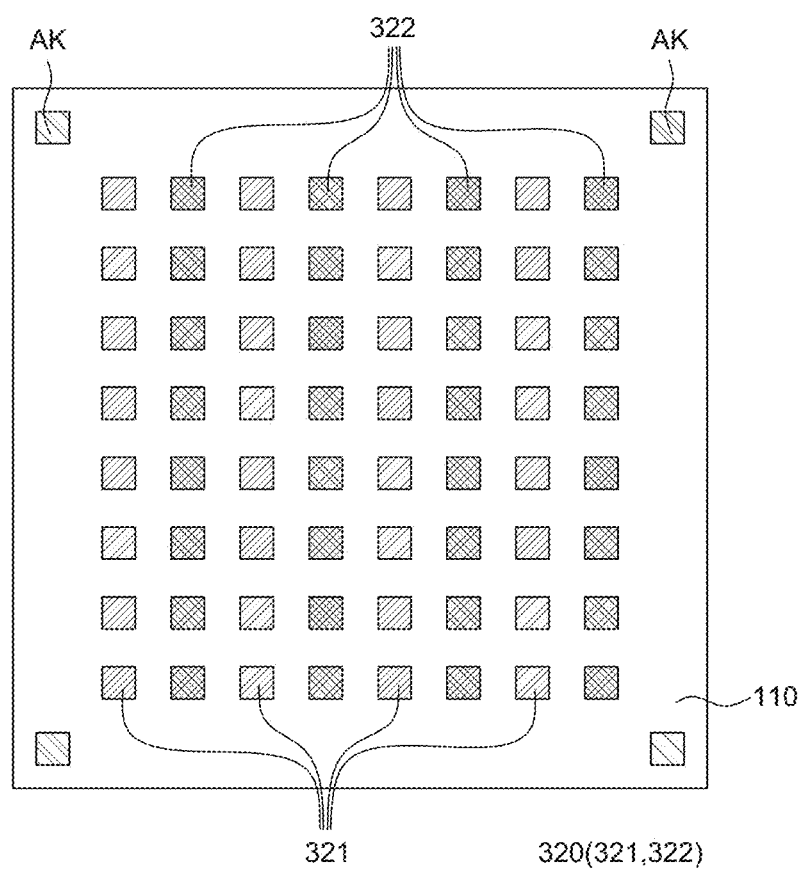
FIGS. 3A to 3G are schematic views of processes for explaining a display device and a method of manufacturing a display device according to another exemplary embodiment of the present disclosure.

Referring to FIG. 3A, a plurality of first LEDs 321, a plurality of second LEDs 322, and a plurality of alignment keys AK are disposed on a wafer 110.

The plurality of first LEDs 321 and the plurality of second LEDs 322 are disposed in different columns on the wafer 110. For example, the plurality of first LEDs 321 may be disposed on odd-numbered columns and the plurality of second LEDs 322 may be disposed on even-numbered columns.

Figure 3B:
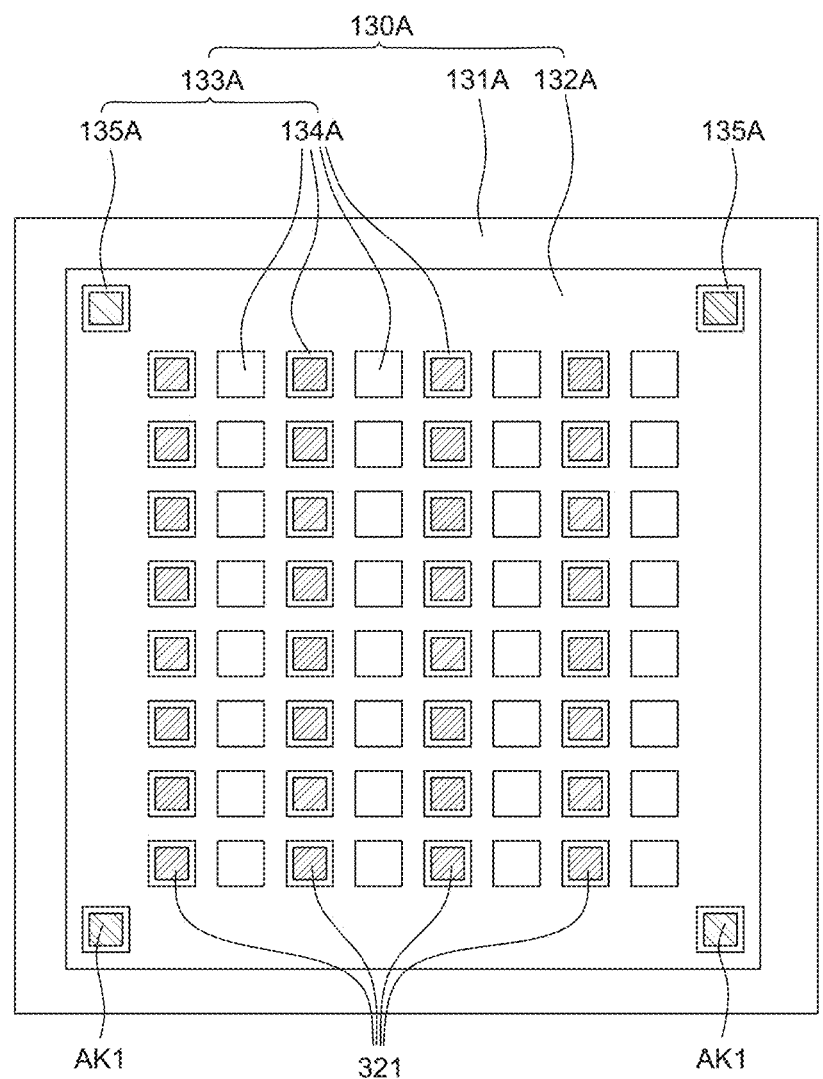

Referring to FIG. 3B, the plurality of first LEDs 321 among the plurality of LEDs 320 of the wafer 110 is transferred onto the first donor 130A. Referring to FIG. 3A, the plurality of first LEDs 321 among the plurality of LEDs 320 disposed on the wafer 110 is disposed in the odd-numbered columns. Therefore, only the plurality of first LEDs 321 among the plurality of LEDs 320 disposed on the wafer 110 is transferred onto the first donor 130A so that the plurality of first LEDs 321 may be disposed only on a plurality of first bumps 134 disposed in odd-numbered columns among a plurality of first bumps 134 of the first donor 130A.

Figure 3C:
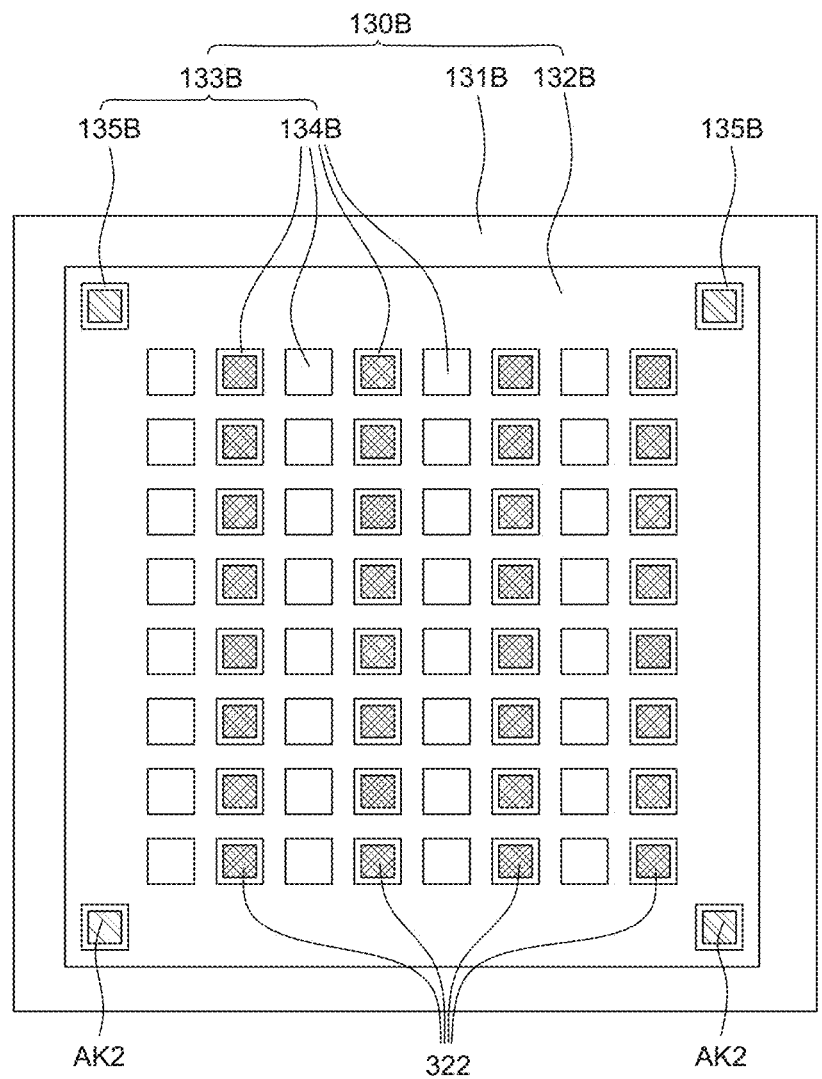

Referring to FIG. 3C, the plurality of second LEDs 322 among the plurality of LEDs 320 of the wafer 110 is transferred onto the second donor 130B. Referring to FIG. 3A, the plurality of second LEDs 322 among the plurality of LEDs 320 disposed on the wafer 110 is disposed in the even-numbered columns. Therefore, only the plurality of second LEDs 322 among the plurality of LEDs 320 disposed on the wafer 110 is transferred onto the second donor 130B so that the plurality of second LEDs 322 may be disposed only on the plurality of first bumps 134 disposed in even-numbered columns among the plurality of first bumps 134 of the second donor 130B.

Figure 3D:
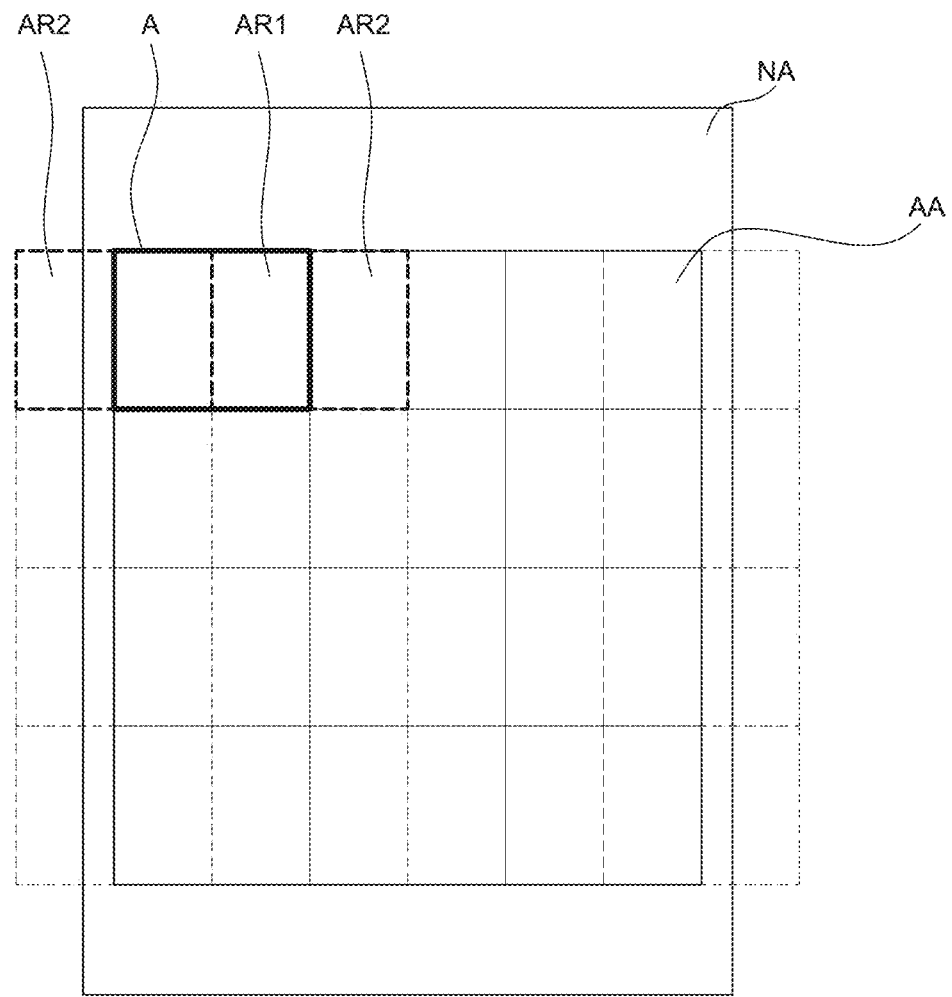

Referring to FIG. 3D, the plurality of LEDs 320 is transferred in a plurality of first areas AR1 and a plurality of second areas AR2 of the display panel PN.

The plurality of first areas AR1 is areas where the plurality of first LEDs 321 of the first donor 130A is transferred and the plurality of first areas AR1 may overlap the entire display area AA. The plurality of first areas AR1 is disposed in a row direction and a column direction in the display area AA. For example, an A area A of FIG. 3D is the same area as one of the first area AR1 of the plurality of first areas AR1.

A plurality of second areas AR2 is areas where the plurality of second LEDs 322 of the second donor 130B is transferred and the plurality of second areas AR2 may overlap the entire display area AA and a part of the non-display area NA. Specifically, the plurality of second areas AR2 is disposed in the row direction and the column direction in the display area AA and a part of the non-display area NA and the plurality of second areas AR2 may entirely overlap the plurality of first areas AR1. For example, one column in the plurality of first areas AR1 and one column in the plurality of second areas AR2 may be different from each other even though they are the same one column. The one column in the plurality of second areas AR2 may be disposed more outwardly than the one column of the plurality of first areas AR1. Therefore, two opposite sides of the plurality of first areas AR1 and two opposite sides of the plurality of second areas AR2 extending in the row direction may overlap each other, but two opposite sides of the plurality of first areas AR1 and two opposite sides of the plurality of second areas AR2 extending in the column direction may not overlap each other. Therefore, two second areas AR2 may overlap one first area AR1.

Figure 3E:
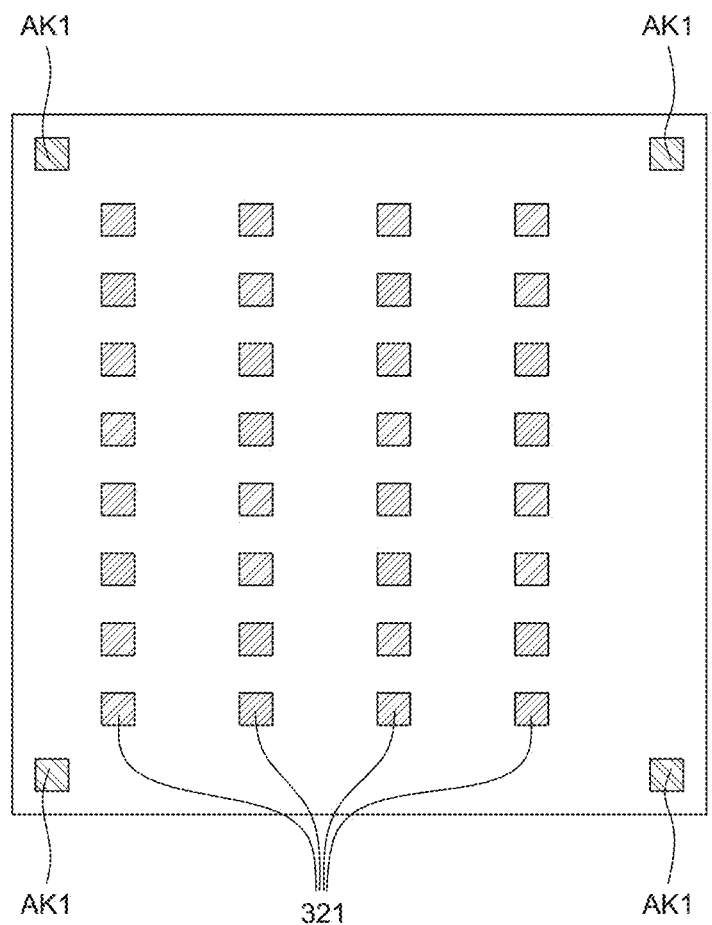

Referring to FIG. 3E, the plurality of first LEDs 321 and the plurality of alignment keys AK1 of the first donor 130A are transferred in the A area A which is the first area AR1 of the display panel PN. In this case, the plurality of LEDs 320 and the plurality of first alignment keys AK1 are transferred in the A area A as those are disposed in the first donor 130A. Therefore, the plurality of first LEDs 321 is disposed in the odd-numbered columns in the A area A and the plurality of first alignment keys AK1 is disposed to be close to the corner of the A area A.

Figure 3F:
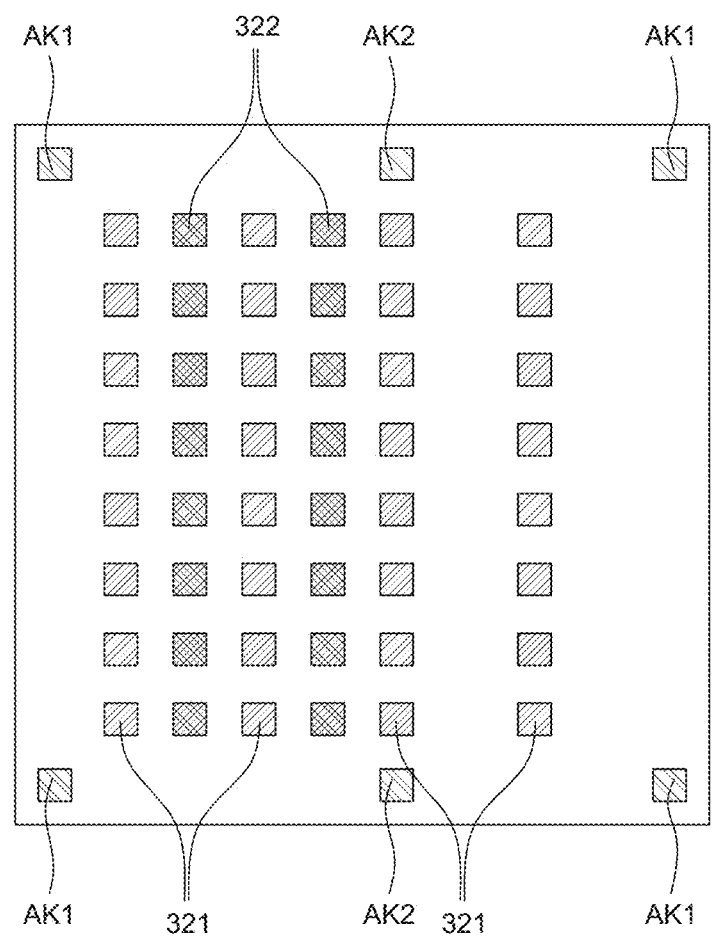

Referring to FIG. 3F, the plurality of second LEDs 322 and a plurality of second alignment keys AK2 of the second donor 130B are transferred in a part of the A area A which is the second area AR2 of the display panel PN. In this case, the second area AR2 may overlap the A area A which is the first area AR1 by approximately ½. The plurality of second LEDs 322 and the plurality of second alignment keys AK2 are transferred into a part of the A area A as those are disposed in the second donor 130B. Specifically, the plurality of second LEDs 322 of the second donor 130B may be transferred in spaces between the plurality of first LEDs 321 disposed in a plurality of columns in the display panel PN. For example, the plurality of second LEDs 322 which is transferred from the second donor 130B onto the display panel PN may be disposed in a second column and a fourth column of the A area A of the display panel PN. The second alignment keys AK2 of the second donor 130B are spaced apart from the plurality of second LEDs 322 in the fourth column of the A area A with a predetermined interval to be disposed at both ends of a fifth column.

Figure 3G:
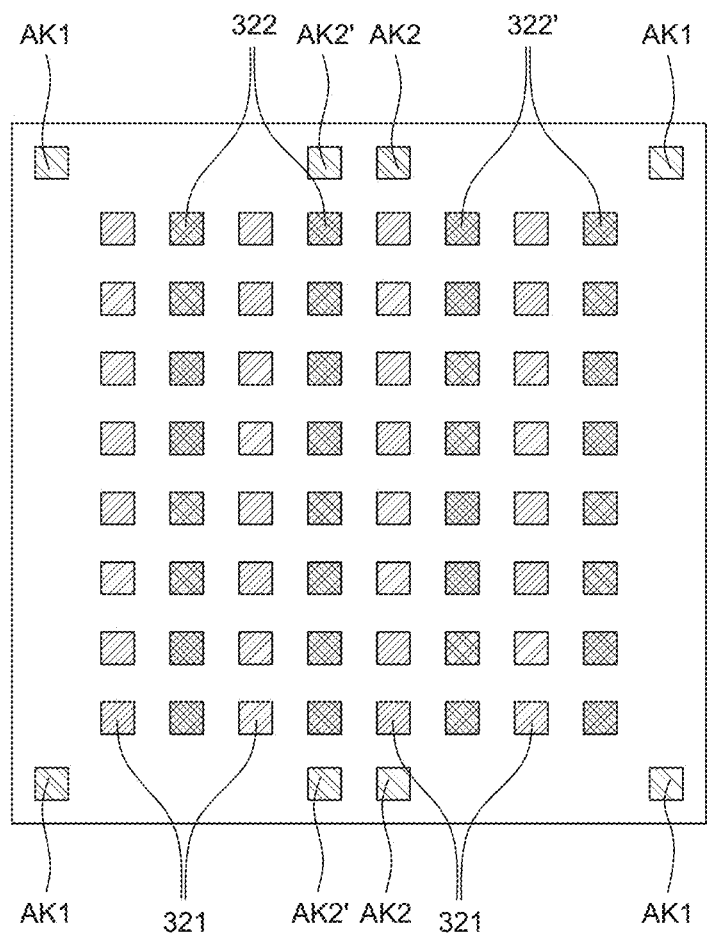

Referring to FIG. 3G, the plurality of second LEDs 322' and the plurality of second alignment keys AK2' of the second donor 130B are transferred in another part of the A area A which is the second area AR2 of the display panel PN. In this case, the plurality of second LEDs 322 disposed on the second donor 130B in FIG. 3F may be grown on a different wafer 110 from the plurality of second LEDs 322' disposed on the second donor 130B of FIG. 3G. For example, the plurality of second LEDs 322 grown on the first wafer may be transferred onto the second donor 130B of FIG. 3F and the plurality of second LEDs 322' grown on the second wafer may be transferred onto the second donor 130B of FIG. 3G.

Specifically, the plurality of second LEDs 322' of the second donor 130B may be transferred in spaces between the plurality of second LEDs 322 disposed in a plurality of columns in the display panel PN in which the second LEDs 322 are not disposed. For example, the plurality of second LEDs 322' which is transferred from the second donor 130B onto the display panel PN may be disposed in a sixth column and an eighth column of the A area A of the display panel PN. The second alignment keys AK2' may be spaced apart from the plurality of second LEDs 322 in the sixth column with a predetermined interval to be disposed at both ends of a fourth column.

Therefore, the plurality of first LEDs 321 transferred from the first donor 130A and the plurality of second LEDs 322 and 322' transferred from the second donor 130B are alternately disposed in different columns. Further, the first alignment keys AK1 transferred from the first donor 130A may be disposed closely to the corner of the first area AR1 and the second alignment keys AK2 and AK2' transferred from the second donor 130B may be disposed between the first alignment keys AK1 of the first area AR1, respectively. In this case, the plurality of second LEDs 322 and 322' in the first area AR1 is transferred from different second donors 130B and emits light of the same color but may be grown on different wafers 110.

Therefore, in the display device and the method of manufacturing a display device according to another exemplary embodiment of the present disclosure, the plurality of LEDs 320 of one wafer 110 is not transferred as it is onto the display panel PN, but may be transferred so as to be alternately disposed in the unit of columns. Specifically, the plurality of LEDs 320 grown on the same wafer 110 or different wafers 110 may be transferred onto the display panel PN so as to be alternately disposed in the unit of columns. For example, only the plurality of first LEDs 321 disposed in the odd-numbered columns in the wafer 110 is primarily transferred onto the first donor 130A and the plurality of first LEDs 321 of the first donor 130A may be secondarily transferred in the odd-numbered columns of the first area AR1 of the display panel PN. Further, only the plurality of second LEDs 322 and 322' disposed in the even-numbered columns in the wafer 110 is primarily transferred onto the second donor 130B and the plurality of second LEDs 322 and 322' of the second donor 130B may be secondarily transferred in the even-numbered columns of the second area AR2 of the display panel PN. Since the first area AR1 and the second area AR2 partially overlap, the plurality of second LEDs 322 and 322' may be disposed in some of the even-numbered columns of the first area AR1 and the even-numbered columns of the second area AR2. Accordingly, the plurality of first LEDs 321 and the plurality of second LEDs 322 and 322' grown on different wafers 110 or the same wafer 110 are alternately disposed in different columns so that the color uniformity in the display panel PN may be improved.

FIGS. 4A to 4H are schematic views of processes for explaining a display device and a method of manufacturing a display device according to still another exemplary embodiment of the present disclosure; A display device and a method of manufacturing a display device illustrated in FIGS. 4A to 4H have the substantially same configuration as the display device and the method of manufacturing a display device of FIGS. 2A to 2J except that the arrangement of a plurality of LEDs 420 is different. Therefore, a redundant description will be omitted.

Figure 4A:
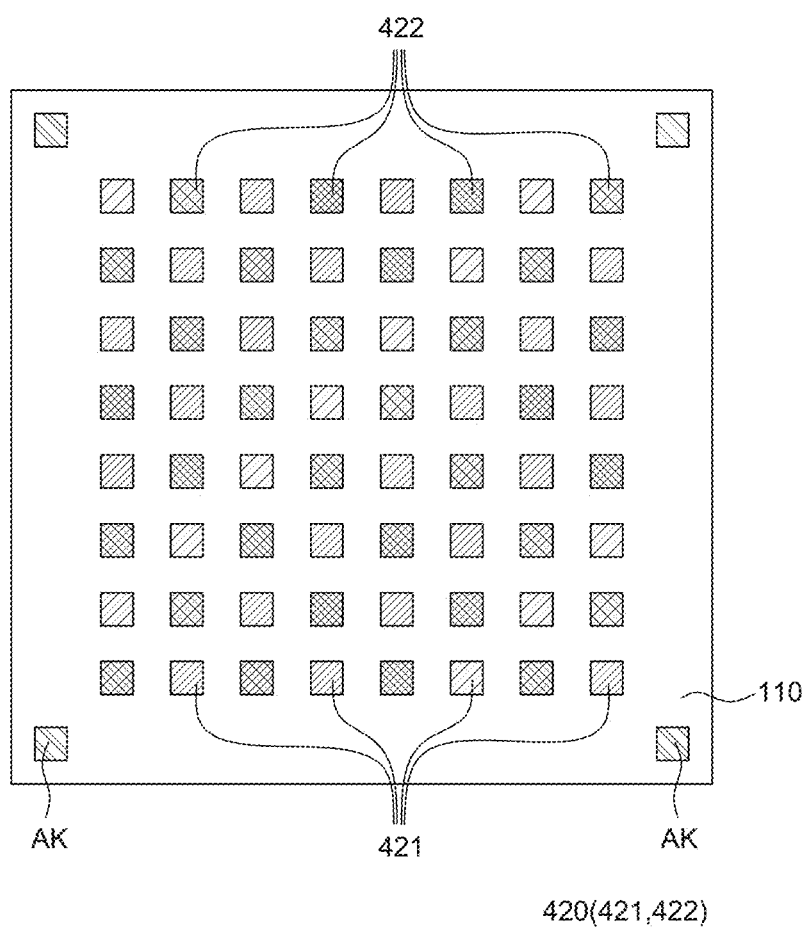
FIGS. 4A to 4H are schematic views of processes for explaining a display device and a method of manufacturing a display device according to still another exemplary embodiment of the present disclosure.

Referring to FIG. 4A, a plurality of first LEDs 421, a plurality of second LEDs 422, and a plurality of alignment keys AK are disposed on a wafer 110.

The plurality of first LEDs 421 and the plurality of second LEDs 422 are alternately disposed in the same row and the same column on the wafer 110. For example, the plurality of first LEDs 421 is disposed only in odd-numbered columns in odd-numbered rows and only in even-numbered columns in even-numbered rows and the plurality of second LEDs 422 is disposed only in even-numbered columns in odd-numbered rows and only in odd-numbered columns in even-numbered rows. Therefore, the plurality of first LEDs 421 and the plurality of second LEDs 422 may form a mosaic pattern on the wafer 110.

Figure 4B:
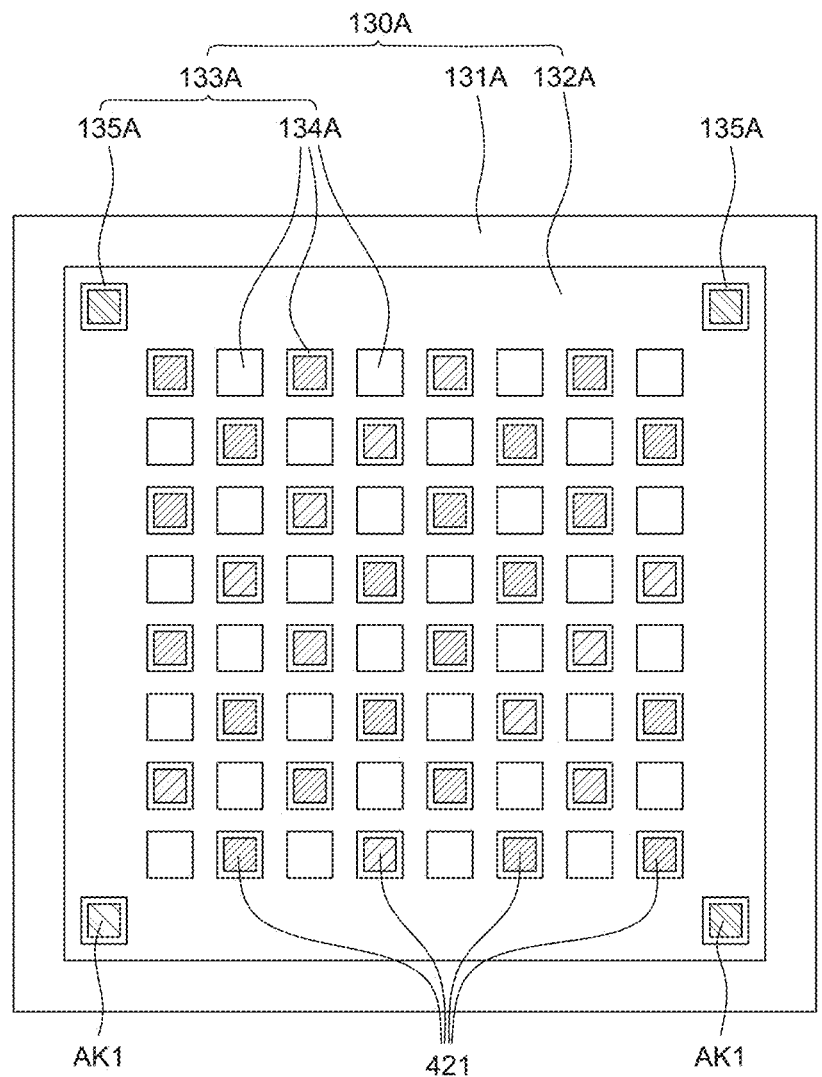

Referring to FIG. 4B, a plurality of first LEDs 421 among the plurality of LEDs 420 of the wafer 110 is transferred onto a first donor 130A. Referring to FIG. 4A, the plurality of first LEDs 421 among the plurality of LEDs 420 disposed on the wafer 110 is disposed in the odd-numbered columns in the odd-numbered rows and in the even-numbered columns in the even-numbered rows. Therefore, only the plurality of first LEDs 421 among the plurality of LEDs 420 disposed on the wafer 110 is transferred onto the first donor 130A so that the plurality of first LEDs 421 may be disposed only on a plurality of first bumps 134 disposed in odd-numbered rows and odd-numbered columns and a plurality of first bumps 134 disposed in even-numbered rows and even-numbered columns among a plurality of first bumps 134 of the first donor 130A. Therefore, the plurality of first LEDs 421 may form a mosaic pattern in the first donor 130A.

Figure 4C:
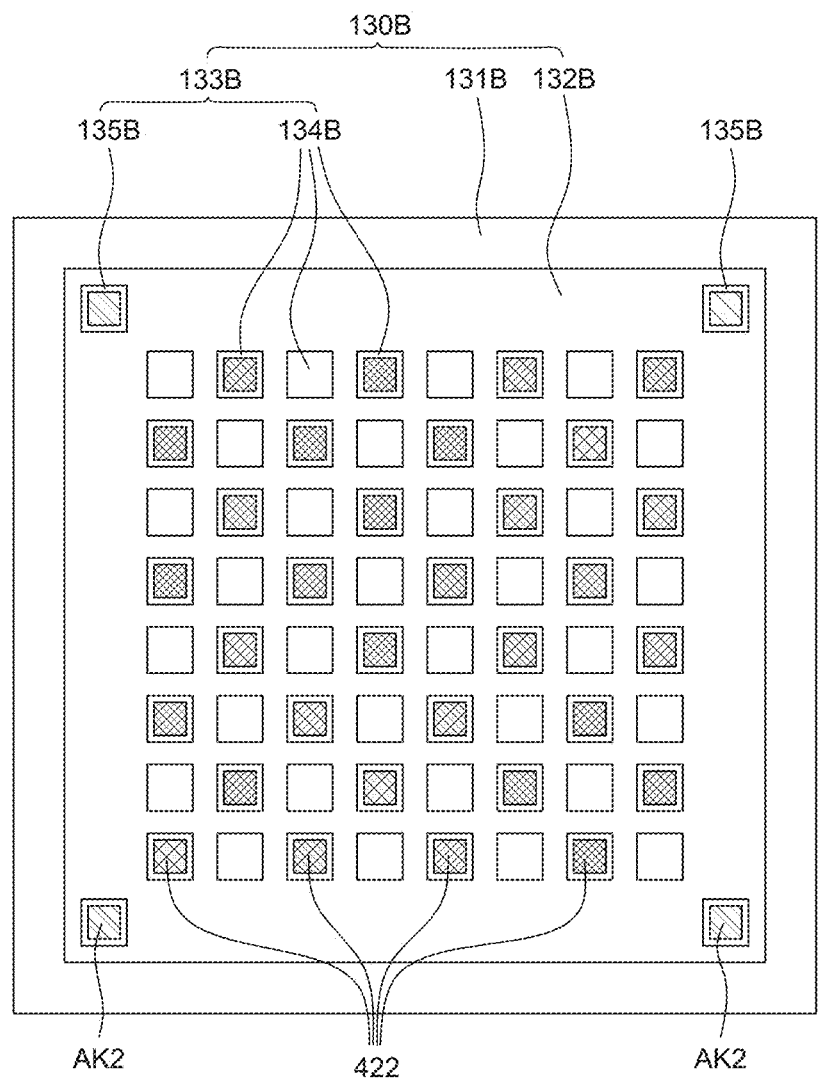

Referring to FIG. 4C, the plurality of second LEDs 422 among the plurality of LEDs 420 of the wafer 110 is transferred onto the second donor 130B. Referring to FIG. 4A, the plurality of second LEDs 422 among the plurality of LEDs 420 disposed on the wafer 110 is disposed in the even-numbered columns in the odd-numbered rows and in the odd-numbered columns in the even-numbered rows. Therefore, only the plurality of first LEDs 422 among the plurality of LEDs 420 disposed on the wafer 110 is transferred onto the second donor 130B so that the plurality of second LEDs 422 may be disposed only on a plurality of first bumps 134 disposed in odd-numbered rows and even-numbered columns and a plurality of first bumps 134 disposed in even-numbered rows and odd-numbered columns among a plurality of first bumps 134 of the second donor 130B. Therefore, the plurality of second LEDs 422 may form a mosaic pattern in the second donor 130B.

Figure 4D:
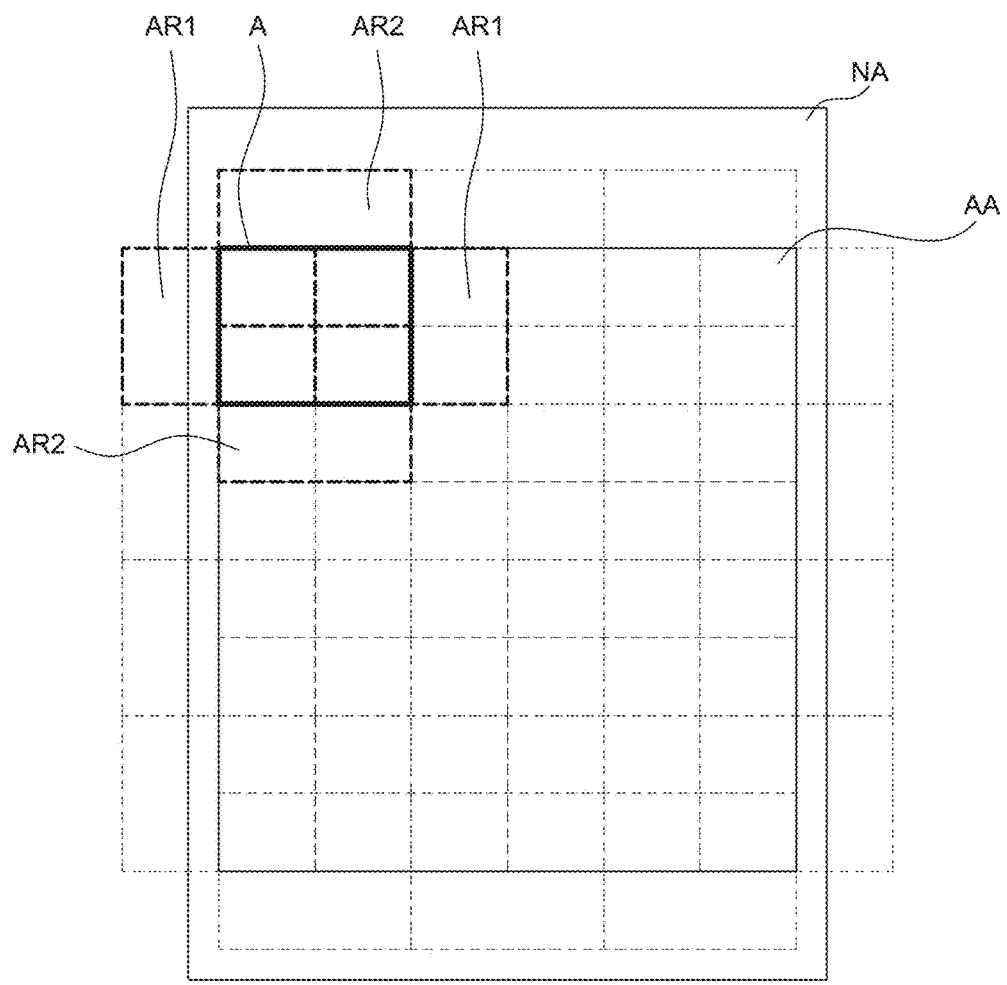

Referring to FIG. 4D, the plurality of LEDs 420 is transferred in the plurality of first areas AR1 and a plurality of second areas AR2 of the display panel PN.

A plurality of first areas AR1 is areas where the plurality of first LEDs 421 of the first donor 130A is transferred and the plurality of first areas AR1 may overlap the entire display area AA and a part of the non-display area NA. Specifically, the plurality of first areas AR1 is disposed in the row direction and the column direction in the display panel PN. For example, some of the plurality of first areas AR1 disposed in an outermost left column may overlap a boundary of the display area AA and the non-display area NA and some of the plurality of first areas AR1 disposed in an outermost right column may overlap the boundary of the display area AA and the non-display area NA.

A plurality of second areas AR2 is areas where the plurality of second LEDs 422 of the second donor 130B is transferred and the plurality of second areas AR2 may overlap the entire display area AA and a part of the non-display area NA. Specifically, the plurality of second areas AR2 is disposed in the row direction and the column direction in the display panel PN. For example, some of the plurality of second areas AR2 disposed in an uppermost row may overlap the boundary of the display area AA and the non-display area NA and some of the plurality of second areas AR2 disposed in a lowermost row may overlap the boundary of the display area AA and the non-display area NA.

In this case, the plurality of LEDs 420 is not actually transferred in a part of the first area AR1 and the second area AR2 which do not overlap the display area AA. Therefore, the plurality of LEDs 420 may be disposed only in a part of the area corresponding to the display AA in the first donor 130A and the second donor 130B which transfer the plurality of LEDs 420 in some of the plurality of first areas AR1 and the plurality of second areas AR2 which overlap the boundary of the display area AA and the non-display area. Alternatively, only the plurality of second LEDs 422 in an area corresponding to the display area AA among the plurality of LEDs 420 disposed in the entire first donor 130A and second donor 130B may be transferred onto the display panel PN.

The plurality of second areas AR2 may partially overlap the plurality of first areas AR1. Specifically, one of the first areas AR1 and one of the second areas AR2 may partially overlap in the row direction and the column direction. One row and one column in the plurality of first areas AR1 and one row and one column in the plurality of second areas AR2 may be different from each other even though they are the same one row and one column. For example, one column of the plurality of first areas AR1 may be disposed more outwardly than one column of the plurality of second area AR2 and one row of the plurality of second areas AR2 may be disposed more outwardly than one row of the plurality of first areas AR1. Therefore, four sides of the plurality of first areas AR1 and four sides of the plurality of second areas AR2 extending in the row direction and the column direction, respectively do not match. Therefore, four second areas AR2 may overlap one first area AR1 and one corner of the first area AR1 may be disposed in the second area AR2.

Figure 4E:
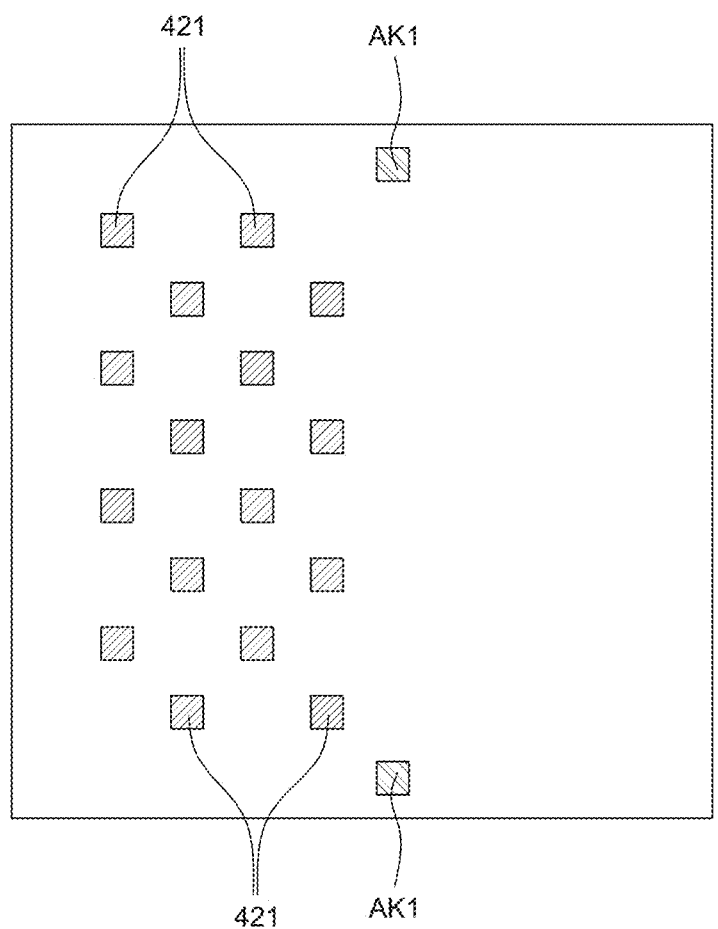

Referring to FIG. 4E, the plurality of first LEDs 421 and the plurality of alignment keys AK1 of the first donor 130A are transferred in a part of the A area A which is the first area AR1 of the display panel PN. In this case, the first area AR1 may overlap the A area A by approximately ½. The plurality of first LEDs 421 and the plurality of first alignment keys AK1 are transferred in a part of the A area A as those are disposed in the first donor 130A. Therefore, the plurality of first LEDs 421 may be disposed in a first column and a third column in an odd-numbered row of the A area A and may be disposed in a second column and a fourth column in an even-numbered row and the plurality of alignment keys AK1 may be disposed at both ends of a fifth column of the A area A.

Figure 4F:
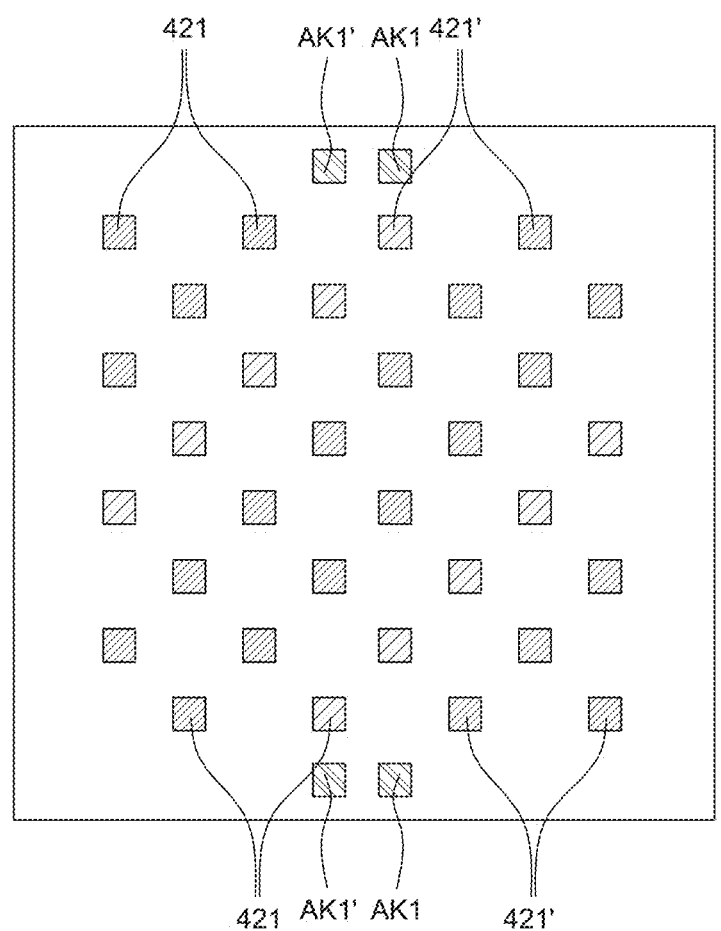

Referring to FIG. 4F, a plurality of first LEDs 421' and a plurality of alignment keys AK1' of the first donor 130A are transferred in another part of the A area A which is the first area AR1 of the display panel PN. In this case, the first area AR1 may overlap the remaining area of the A area A by approximately ½. The plurality of first LEDs 421' and the plurality of first alignment keys AK1' are transferred into another part of the A area A as those are disposed in the first donor 130A. Therefore, the plurality of first LEDs 421' may be disposed in a fifth column and a seventh column in an odd-numbered row of the A area A and may be disposed in a sixth column and an eighth column in an even-numbered row and the plurality of alignment keys AK1' may be disposed at both ends of a fourth column of the A area A.

Further, the plurality of first LEDs 421' disposed on the first donor 130A in FIG. 4F may be grown on a different wafer 110 from the plurality of first LEDs 421 disposed on the first donor 130A of FIG. 4E. For example, the plurality of first LEDs 421 grown on the first wafer may be transferred onto the first donor 130A of FIG. 4E and the plurality of first LEDs 421' grown on the second wafer may be transferred onto the first donor 130A of FIG. 4F.

Figure 4G:
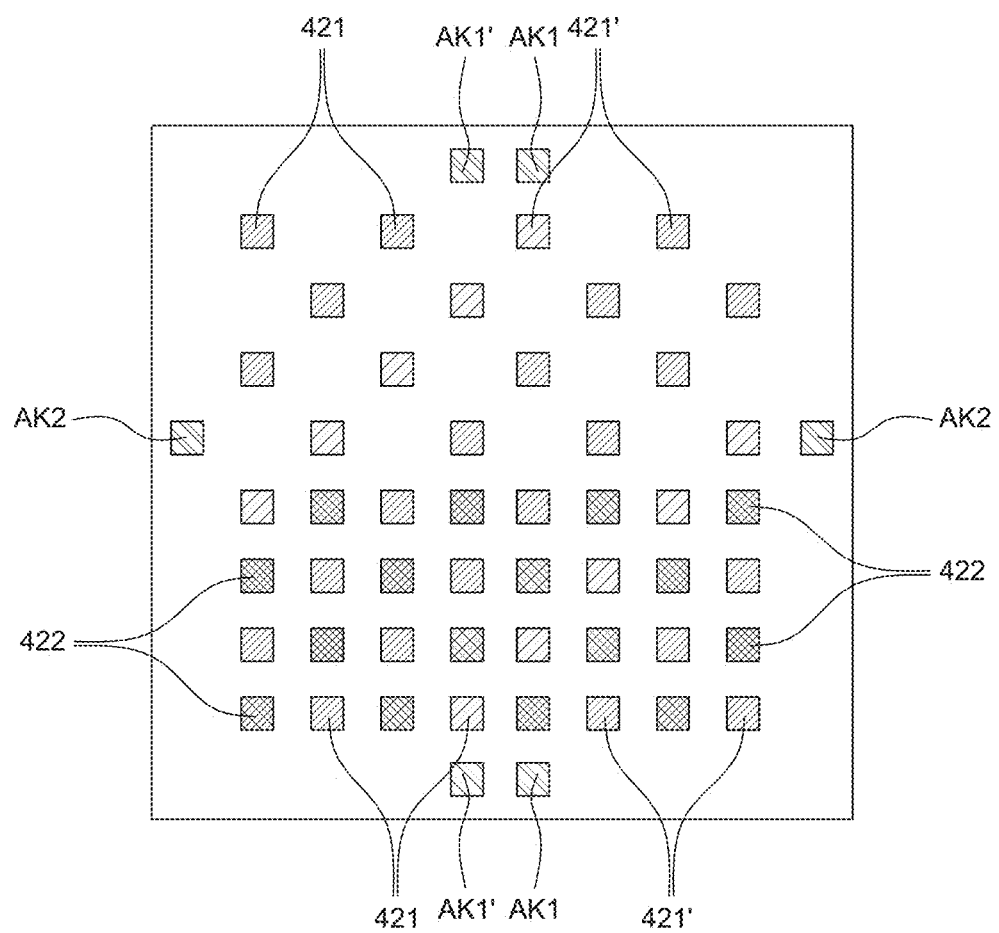

Referring to FIG. 4G, the plurality of second LEDs 422 and a plurality of second alignment keys AK2 of the second donor 130B are transferred onto a part of the A area A which is the second area AR2 of the display panel PN. In this case, the second area AR2 may overlap a part of the A area A by approximately ½. The plurality of second LEDs 422 and the plurality of second alignment keys AK2 are transferred into a part of the A area A as those are disposed in the second donor 130B. Therefore, the plurality of second LEDs 422 may be disposed in a sixth row and an eighth row in an odd-numbered column of the A area A and may be disposed in a fifth row and a seventh row in an even-numbered column and the plurality of second alignment keys AK2 may be disposed at both ends of a fourth row of the A area A.

Figure 4H:
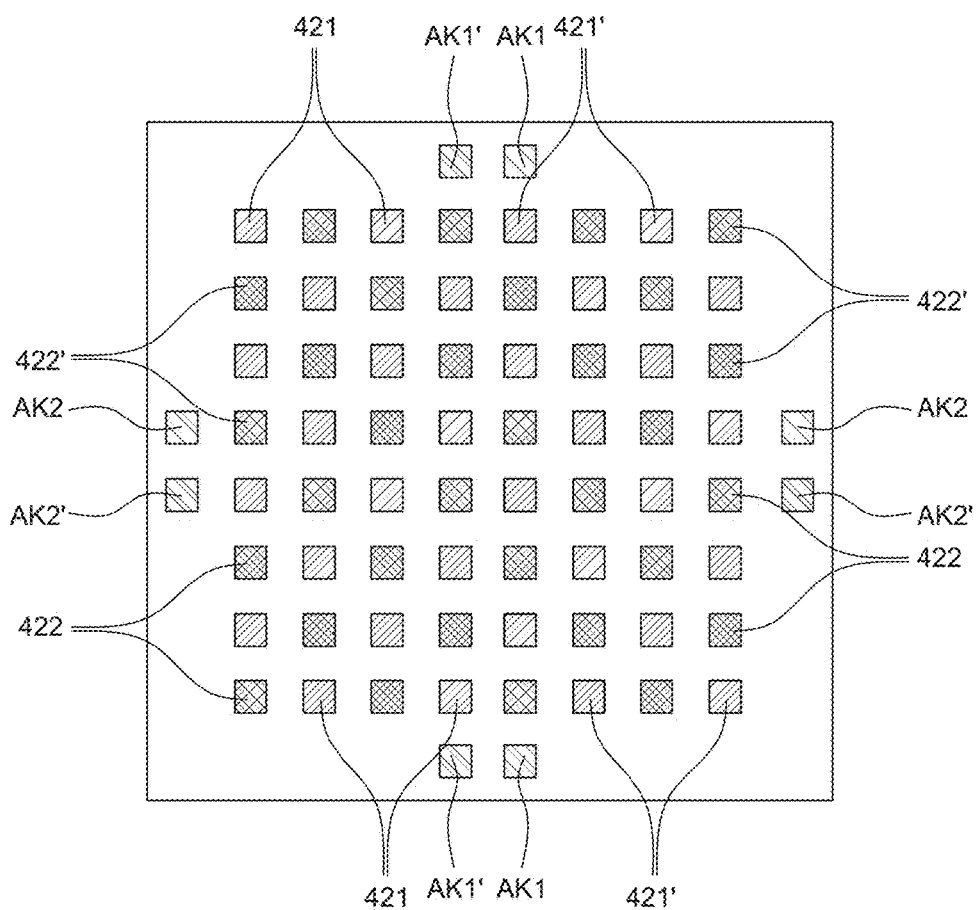

Referring to FIG. 4H, the plurality of second LEDs 422' and the plurality of second alignment keys AK2' of the second donor 130B are further transferred onto another part of the A area A which is the second area AR2 of the display panel PN. In this case, the second area AR2 may overlap the remaining area of the A area A by approximately ½. The plurality of second LEDs 422' and the plurality of second alignment keys AK2' are transferred in another part of the A area A as those are disposed in the second donor 130B. Therefore, the plurality of second LEDs 422' may be disposed in a second row and a fourth row in an odd-numbered column of the A area A and may be disposed in a first row and a third row in an even-numbered column and the plurality of second alignment keys AK2' may be disposed at both ends of a fifth row.

The plurality of second LEDs 422 of the second donor 130B in FIG. 4G may be grown on a different wafer 110 from the plurality of second LEDs 422' of the second donor 130B of FIG. 4H. For example, the plurality of first LEDs 421 grown on the first wafer may be transferred onto the second donor 130B of FIG. 4G and the plurality of second LEDs 422' grown on the second wafer may be transferred onto the second donor 130B of FIG. 4H.

Therefore, in the display device and the method of manufacturing a display device according to another exemplary embodiment of the present disclosure, the plurality of LEDs 420 of one wafer 110 is not directly transferred onto the display panel PN, but may be transferred so as to be alternately disposed in the same row and the same column. Specifically, the plurality of LEDs 420 grown on the same wafer 110 or different wafers 110 may be transferred onto the display panel PN so as to be alternately disposed in the rows and the columns. Therefore, the plurality of first LEDs 421 and 421' and the plurality of second LEDs 422 and 422' which are finally transferred onto the display panel PN may be alternately disposed both in the row direction and the column direction. Therefore, the plurality of first LEDs 421 and 421' grown on different wafers 110 or the same wafer 110 may be transferred onto the first donor 130A and the display panel PN to form a mosaic pattern. Further, the plurality of second LEDs 422 and 422' grown on different wafers 110 or the same wafer 110 may be transferred onto the second donor 130B and the display panel PN to form a mosaic pattern which is different from the mosaic pattern of the first LEDs 421.

Hereinafter, effects of the display device and the method of manufacturing a display device according to various exemplary embodiments of the present disclosure will be described in detail with reference to FIGS. 5A to 5F.

Figure 5A:
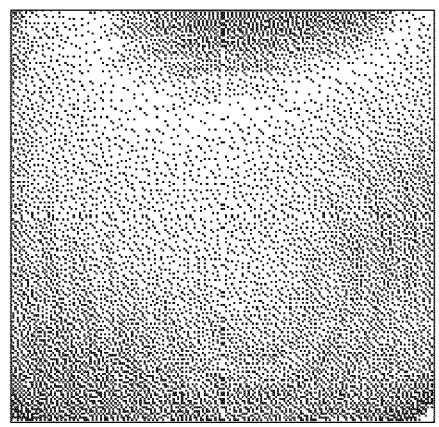
FIGS. 5A to 5D are views for explaining effects of a display device and a method of manufacturing a display device according to various exemplary embodiments of the present disclosure by comparing with a display device and a method of manufacturing a display device according to a comparative example.
Figure 5B:
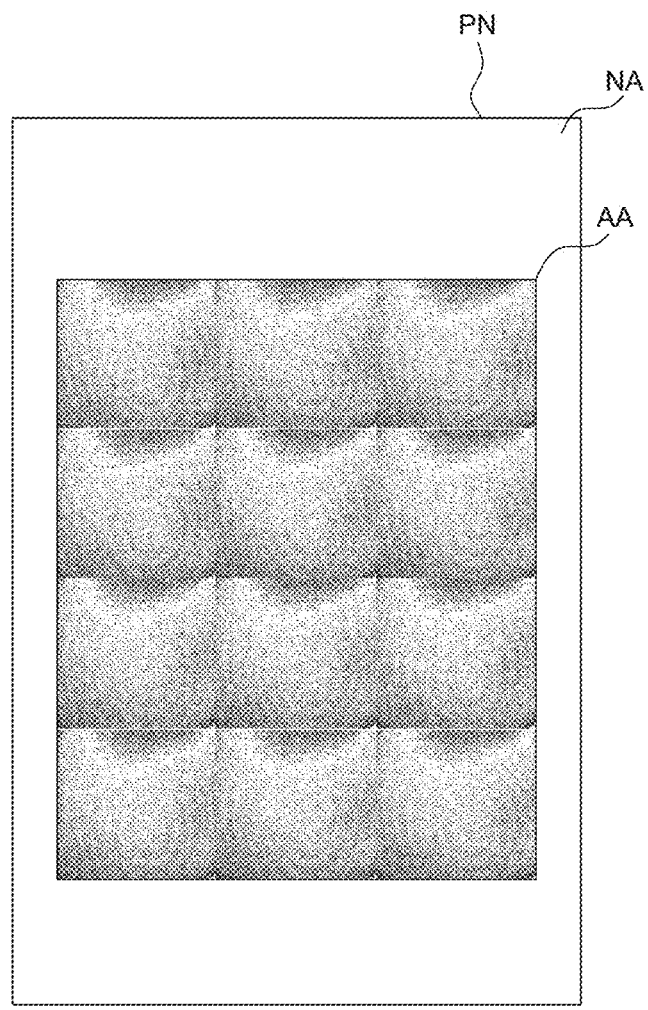
Figure 5C:
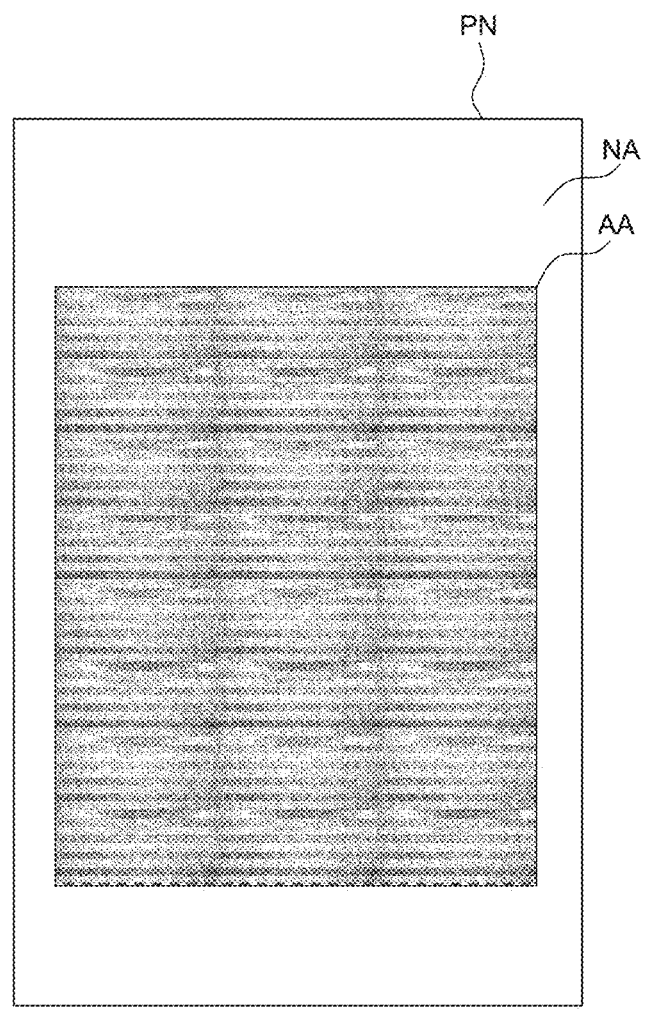
Figure 5D:
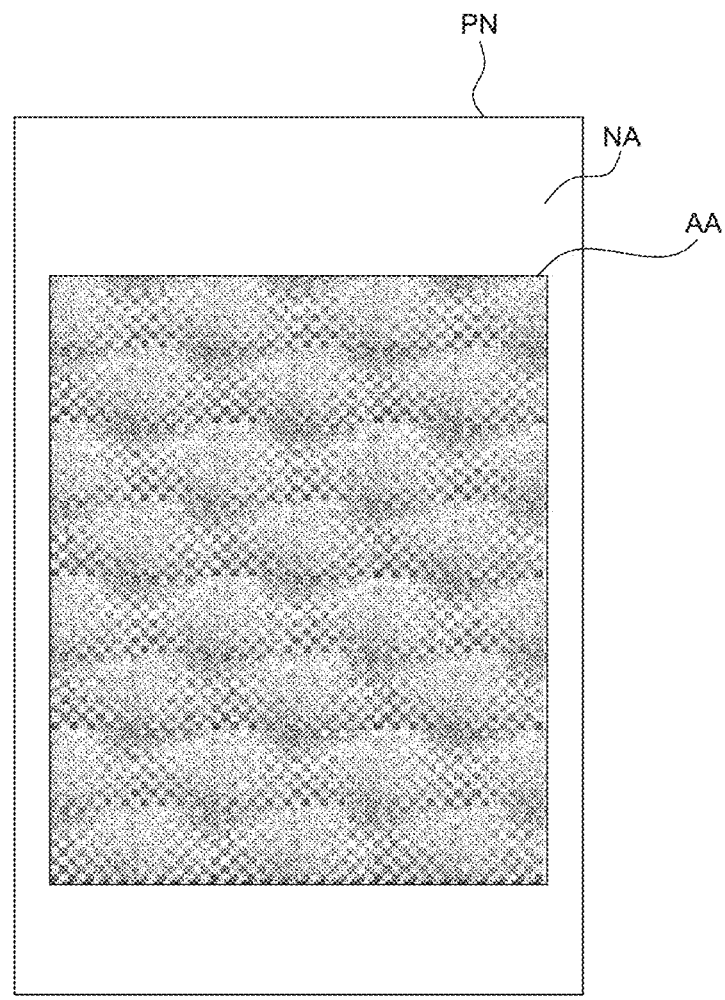

FIGS. 5A to 5D are views for explaining effects of a display device and a method of manufacturing a display device according to various exemplary embodiments of the present disclosure by comparing with a display device and a method of manufacturing a display device according to a comparative example. FIG. 5A is a view illustrating a wavelength distribution between a plurality of LEDs on a wafer. FIG. 5B is a view illustrating a wavelength distribution of a plurality of LEDs disposed in a display panel according to a display device and a method of manufacturing a display device according to a comparative example. FIG. 5C is a view illustrating a wavelength distribution of a plurality of LEDs disposed in a display panel according to a display device and a method of manufacturing a display device according to an exemplary embodiment of the present disclosure. FIG. 5D is a view illustrating a wavelength distribution of a plurality of LEDs disposed in a display panel according to a display device and a method of manufacturing a display device according to another exemplary embodiment of the present disclosure.

Referring to FIG. 5A, a wavelength distribution of a plurality of LEDs grown on one wafer may vary. A plurality of LEDs which emits light of the same color may be grown on one wafer. However, even though the LEDs are grown on one wafer, wavelengths of light actually emitted from the LED may slightly vary due to a process error. Therefore, when the plurality of LEDs grown on one wafer is directly primarily transferred onto a donor and the plurality of LEDs of the donor is directly secondarily transferred on a display panel, the wavelength distributions between the plurality of LEDs in the wafer may be directly represented onto the display panel.

Referring to FIG. 5B, in a display device and a method of manufacturing a display device according to a comparative example, a plurality of LEDs of a wafer is directly transferred onto one donor and the plurality of LEDs transferred onto the one donor is transferred onto a display panel again. Even in an area where one donor transfers the plurality of LEDs in the display panel, the wavelength distributions between the plurality of LEDs are different so that the color of the light emitted from the plurality of LEDs may not be uniform. Further, between an area where one wafer and one donor transfer a plurality of LEDs in the display panel and an area where the other wafer and the other donor transfer the plurality of LEDs and at a boundary between the areas, the color of the light emitted from the plurality of LEDs may not be uniform.

In the display device and the method of manufacturing a display device according to a comparative example, the plurality of LEDs is transferred onto the display panel as those are disposed on a plurality of wafers. Therefore, even in the display panel, the wavelength distribution of each of the plurality of LEDs of the plurality of wafers may be shown in form of tiles and the color deviation may be easily perceived by the viewer.

Referring to FIG. 5C, it is understood that the wavelength distributions of the plurality of LEDs 120 disposed in the display panel PN of the display device according to an exemplary embodiment of the present disclosure is improved as compared with the display device according to the comparative example of FIG. 5B. As described with reference to FIGS. 2A to 2J above, in the display device and the method of manufacturing a display device according to the exemplary embodiment of the present disclosure, a plurality of first LEDs 121 disposed in the odd-numbered rows among the plurality of LEDs 120 grown on one wafer 110 is transferred onto the first donor 130A and a plurality of second LEDs 122 and 122' disposed in the even-numbered rows is transferred onto the second donor 130B. The plurality of first LEDs 121 of the first donor 130A is transferred onto the display panel PN and the plurality of second LEDs 122 and 122' of the second donor 130B is transferred in the space between the plurality of first LEDs 121 disposed in the plurality of rows. Therefore, the plurality of LEDs 120 grown on one wafer 110 is transferred onto the display panel PN to be alternately disposed in the unit of rows so that the wavelength deviation between the plurality of LEDs 120 on the wafer is not directly represented on the display panel PN. But the color uniformity of the light emitted from the plurality of LEDs 120 in the display panel PN may be improved. Since the color uniformity is improved, the deviation between the plurality of LEDs 120 is not recognized by the viewers and reliability of the display device is also improved.

Referring to FIG. 5D, it is understood that the wavelength distributions of the plurality of LEDs 420 disposed in the display panel PN of the display device according to another exemplary embodiment of the present disclosure is improved in the color uniformity as compared with the display device according to the comparative example of FIG. 5B. As described with reference to FIGS. 4A to 4H above, in the display device and the method of manufacturing a display device according to another exemplary embodiment of the present disclosure, a plurality of first LEDs 421 and 421' formed by a mosaic pattern among the plurality of LEDs 420 grown on one wafer 110 is transferred onto the first donor 130A and a plurality of second LEDs 422 and 422' formed by a different mosaic pattern from that of the plurality of first LEDs 421 and 421' is transferred onto the second donor 130B. The plurality of first LEDs 421 and 421' of the first donor 130A is transferred onto the display panel PN and the plurality of second LEDs 422 and 422' of the second donor 130B is transferred onto the display panel PN to be alternately disposed both in the row direction and the column direction. Therefore, the plurality of LEDs 420 grown on one wafer 110 is transferred onto the display panel PN to be alternately disposed in the mosaic pattern so that the wavelength deviation between the plurality of LEDs 420 on the wafer 110 is not represented on the display panel PN. But the color uniformity of the light emitted from the plurality of LEDs 420 in the display panel PN may be improved. Since the color uniformity is improved, the deviation between the plurality of LEDs 420 is not recognized by the viewers and reliability of the display device is also improved.

In the display device and the method of manufacturing a display device according to various exemplary embodiments of the present disclosure, even though there is a large difference in a wavelength between the plurality of LEDs 120, 320, and 420 on the wafer 110, the plurality of LEDs 120, 320, and 420 may be uniformly mixed during the transferring process. Therefore, an allowable range of the wavelength difference between the plurality of LEDs 120, 320, and 420 grown on one wafer 110 may be increased. Therefore, since the plurality of LEDs 120, 320, and 420 which has been determined to be defective in the related art may be used for the display panel PN, a manufacturing cost may be reduced.

Figure 6A:
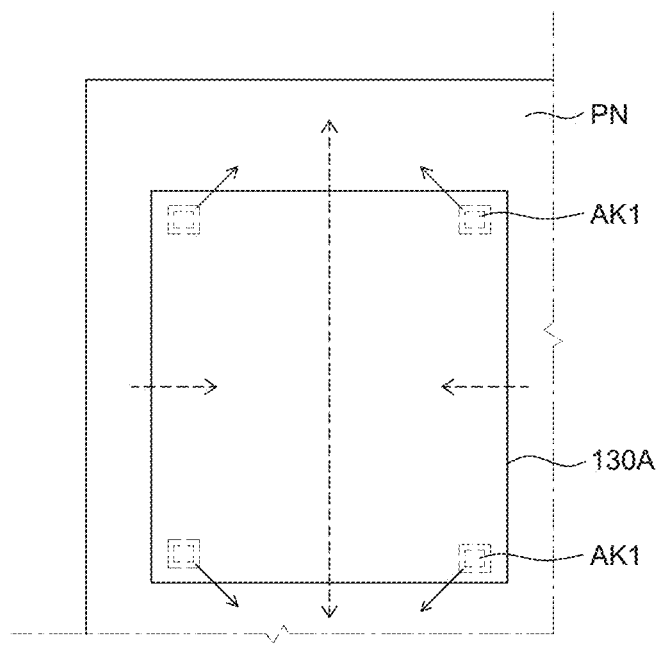
FIGS. 6A to 6C are views for explaining features of a display device according to various exemplary embodiments of the present disclosure.
Figure 6B:
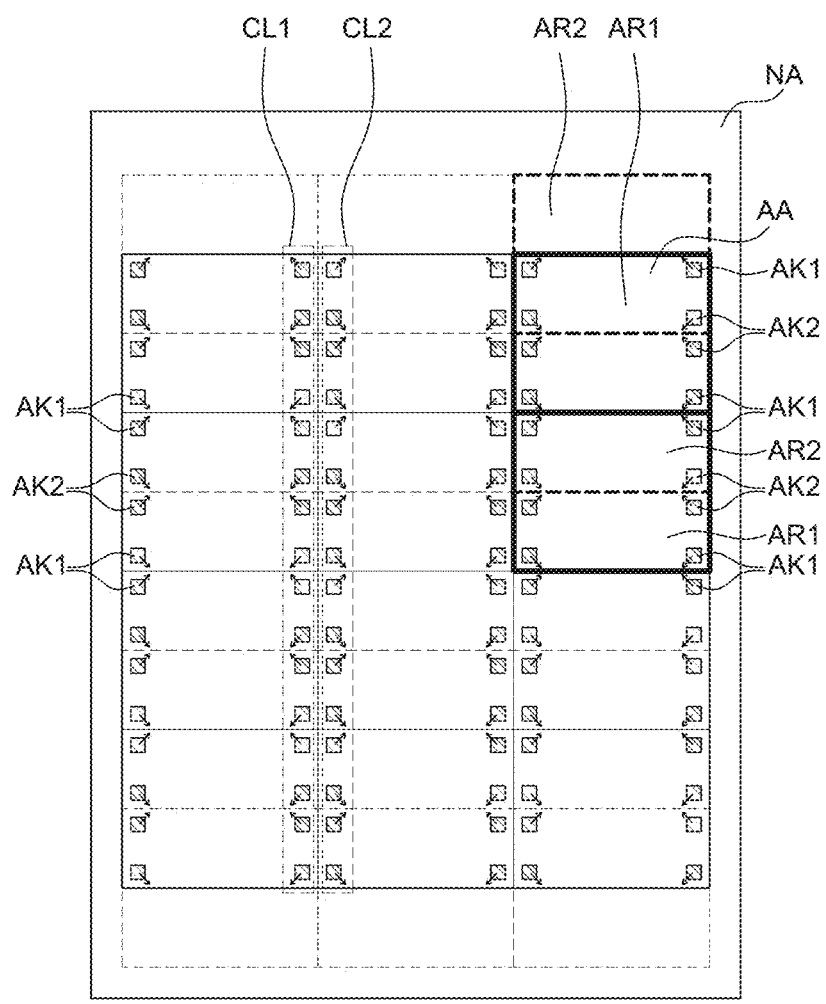
Figure 6C:
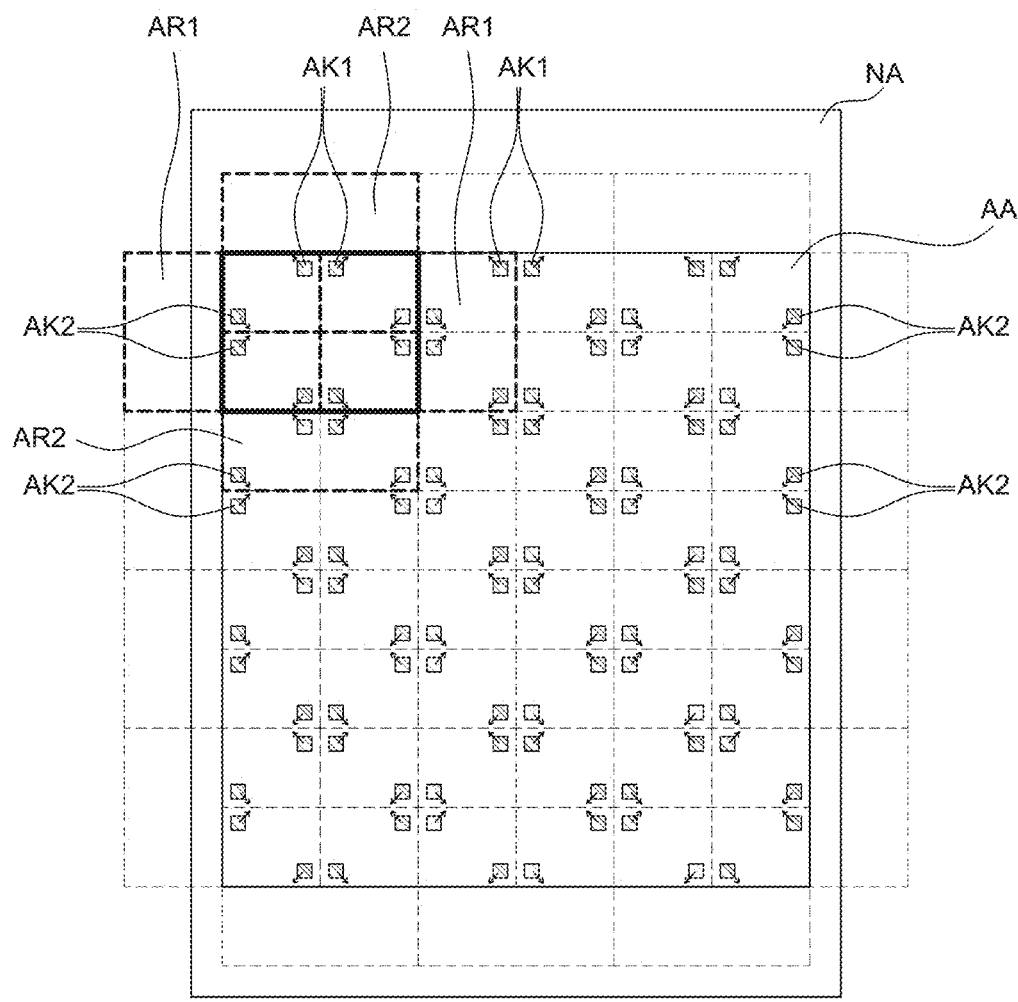

FIGS. 6A to 6C are views for explaining features of a display device according to various exemplary embodiments of the present disclosure. FIG. 6A is a plan view of a first donor and a display panel when a plurality of LEDs of the first donor is transferred onto a display panel. FIG. 6B is a view illustrating a movement of an alignment key in a display panel according to a display device and a method of manufacturing a display device of FIGS. 2A to 2J. FIG. 6C is a view illustrating a movement of an alignment key in a display panel according to a display device and a method of manufacturing a display device of FIGS. 4A to 4H. In FIG. 6A, for the convenience of description, only the first alignment key AK1 of a first donor 130A is illustrated.

Referring to FIG. 6A, in order to transfer the plurality of LEDs 120 and the first alignment keys AK1 of the first donor 130A onto the display panel PN, after loading the first donor 130A on the display panel PN, a pressure is applied to the first donor 130A. In this case, the adhering layer 132A and the plurality of bumps 133A of the first donor 130A may be formed of a flexible material such as PDMS, PUA, PEG, epoxy resin, or urethane resin, as described above. Therefore, as the pressure is applied to the first donor 130A, the adhering layer 132A and the plurality of bumps 133A may be deformed.

For example, when the first donor 130A is a rectangular shape, the first donor 130A may extend in a major axis direction and may be shortened in a minor axis direction. Therefore, the first alignment key AK1 of the first donor 130A moves outwardly from the first donor 130A in the major axis direction and the first alignment keys AK1 moves inwardly from the first donor 130A in the minor axis direction. Specifically, the first alignment keys AK1 disposed in the row direction in the first donor 130A move to be close to each other and the first alignment keys AK1 disposed in the column direction move to be spaced apart from each other. However, a deformed shape of the first donor 130A and a movement direction of the first alignment keys AK1 may vary depending on a shape of the first donor 130A and is not limited thereto.

In the meantime, an interval between the first alignment keys AK1 and some of the plurality of LEDs 120 is always constant. For example, the interval between the first alignment key AK1 and the LED 120 disposed at the shortest distance may always be constant. Therefore, the plurality of LEDs 120 may also move in the movement direction of the first alignment keys AK1. Therefore, a transferring position of the first donor 130A may be identified through the movement direction of the first alignment key AK1. Further, even though the first alignment keys AK1 are not transferred onto the display panel PN, the transferring position of the first donor 130A may be identified through the movement direction of the plurality of LEDs 120.

Hereinafter, movement of the alignment keys AK according to the transferring position of the donor 130 will be described in more detail with reference to FIGS. 6B and 6C. In this case, for the convenience of description, it is assumed that the plurality of alignment keys AK of the donor 130 is transferred onto the display panel PN and only the alignment key AK is illustrated on the display panel PN.

Referring to FIG. 6B, a plurality of first alignment keys AK1 transferred from the first donor 130A is disposed at corners of the plurality of first areas AR1 and a plurality of second alignment keys AK2 transferred from the second donor 130B is disposed at corners of a plurality of second areas AR2. Some of two sides of one first area AR1 may partially overlap some of two sides of one second area AR2. That is, a partial area of the first area AR1 and a partial area of the second area AR2 may vertically overlap.

First, the first alignment key AK1 transferred from the first donor 130A onto the display panel PN may be moved to be close to the first alignment key AK1 disposed in an adjacent row. Further, the first alignment key AK1 may be moved to be spaced apart from the first alignment key AK1 disposed in an adjacent column.

Therefore, in the plurality of first LEDs 121 transferred from the first donor 130A onto the display panel PN, similarly to the movement direction of the first alignment key AK1, an interval between a first LEDs 121 disposed in a specific row and a first LEDs 121 disposed in a row adjacent to the specific row is the smallest and an interval between a first LED 121 disposed in a specific column and a first LED 121 disposed in a column adjacent to the specific column is the largest. Therefore, the intervals between the plurality of first LEDs 121 disposed on the same row or the same column may not be constant.

Similarly to the first alignment key AK1, a second alignment key AK2 transferred from the second donor 130B onto the display panel PN may move to be close to the second alignment key AK2 disposed in an adjacent row. Further, the second alignment key AK2 may move to be spaced apart from the second alignment key AK2 disposed in an adjacent column.

Therefore, in the plurality of second LEDs 122 transferred from the second donor 130B onto the display panel PN, similarly to the movement direction of the second alignment key AK2, an interval between a second LEDs 122 disposed in a specific row and a second LED 122 disposed in a row adjacent to the specific row is the smallest and an interval between a second LED 122 disposed in a specific column and a second LED 122 disposed in a column adjacent to the specific column is the largest. Therefore, the intervals between the plurality of second LEDs 122 disposed on the same row or the same column may not be constant.

In the meantime, the plurality of first LEDs 121 and the plurality of second LEDs 122 are disposed in different rows and alternately disposed on the same column. As described above, the plurality of first alignment keys AK1 disposed in a first column CL1 and a plurality of first alignment keys AK1 disposed in a second column CL2 adjacent to the first column CL1 move to be spaced apart from each other. Similarly, the plurality of second alignment keys AK2 disposed in the first column CL1 and a plurality of second alignment keys AK2 disposed in a second column CL2 move to be spaced apart from each other. For example, referring to FIG. 6B, when it is assumed that a first column CL1 and a second column CL2 are adjacent to each other in two first areas AR1 adjacent in the row direction, the plurality of first alignment keys AK1 disposed in the first column CL1 and the plurality of first alignment keys AK1 disposed in the second column CL2 may move to be spaced apart from each other. Further, when it is assumed that a first column CL1 and a second column CL2 are adjacent to each other in two second areas AR2 adjacent in the row direction, the plurality of second alignment keys AK2 disposed in the first column CL1 and the plurality of second alignment keys AK2 disposed in the second column CL2 may also move to be spaced apart from each other.

The plurality of first LEDs 121 moves in the same direction as the first alignment key AK1 and the plurality of second LEDs 122 moves in the same direction as the second alignment key AK2. Therefore, an interval between the plurality of first LEDs 121 disposed in the first column CL1 and the plurality of first LEDs 121 disposed in the second column CL2 may be larger than the interval between the plurality of other first LEDs 121. Therefore, an interval between the plurality of second LEDs 122 disposed in the first column CL1 and the plurality of second LEDs 122 disposed in the second column CL2 may be larger than the interval between the plurality of other second LEDs 122. Accordingly, the interval between the plurality of first LEDs 121 is the largest at the boundary of the first areas AR1 adjacent to each other in row direction and the interval between the plurality of second LEDs 122 may be the largest at the boundary of the second areas AR2 adjacent to each other in row direction.

Referring to FIG. 6C, a plurality of first alignment keys AK1 transferred from the first donor 130A is disposed at corners of the plurality of first areas AR1 and a plurality of second alignment keys AK2 transferred from the second donor 130B is disposed at corners of a plurality of second areas AR2. One of corners of one first area AR1 may be disposed in one second area AR2 and one of corners of one second area AR2 may be disposed in one first area AR1. That is, four second areas AR2 may overlap one first area AR1.

The first alignment key AK1 transferred from the first donor 130A onto the display panel PN may move to be close to the first alignment key AK1 disposed in an adjacent row. Further, the first alignment key AK1 may move to be spaced apart from the first alignment key AK1 disposed in an adjacent column. Therefore, an interval between the first LED 421 disposed in a specific row and a first LED 421 disposed in an adjacent row may be the smallest.

In the meantime, similarly to the first alignment key AK1, a second alignment key AK2 transferred from the second donor 130B onto the display panel PN may move to be close to the second alignment key AK2 disposed in an adjacent row. Further, the second alignment key AK2 may move to be spaced apart from the second alignment key AK2 disposed in an adjacent column. Therefore, an interval between the second LED 422 disposed in a specific row and a second LED 422 disposed in an adjacent row may be the smallest.

In the meantime, the plurality of first LEDs 421 and the plurality of second LEDs 422 are alternately disposed in the same row and alternately disposed in the same column. In this case, the plurality of first alignment keys AK1 and the plurality of second alignment keys AK2 may be disposed in different rows and different columns. Therefore, when the interval between the plurality of first LEDs 421 disposed in the specific row and the plurality of first LEDs 421 disposed in the adjacent row is the smallest, the interval between the plurality of second LEDs 422 disposed in the specific row and the plurality of second LEDs 422 disposed in the adjacent row may not be the smallest. Therefore, among the plurality of first LEDs 421 and the plurality of second LEDs 422 disposed in the same row, the plurality of first LEDs 421 may be disposed to be closer to the LED 420 in the adjacent row or the plurality of second LEDs 422 may be disposed to be closer to the LED 420 in the adjacent row.

In the display device and the method of manufacturing a display device according to various exemplary embodiments of the present disclosure, the transferring area of the donor 130 may be identified using a directivity of the plurality of alignment keys AK and the plurality of LEDs 120, 320, and 420 transferred onto the display panel PN. For example, the interval of the plurality of LEDs 120, 320, and 420 transferred from different donors 130 may be largest or smallest at the boundary depending on a deformation shape of the donor 130. Further, when the plurality of LEDs 120, 320, and 420 disposed in the same area is transferred from different donors, the plurality of LEDs may have different directivities. Therefore, centers of the plurality of LEDs 120, 320, and 420 disposed in the same row or the same column may not be disposed on the same line. As described above, the transferring area may be identified from the directivity of the plurality of LEDs 120, 320, and 420 and/or the plurality of alignment keys AK transferred onto the display panel PN.

The display device according to various exemplary embodiments of the present disclosure will be described as follows:

According to an aspect of the present disclosure, a display device includes a display panel which includes a plurality of sub-pixels disposed in a plurality of rows and a plurality of columns and a plurality of first LEDs and a plurality of second LEDs disposed in the plurality of sub-pixels in which the plurality of first LEDs and the plurality of second LEDs are alternately disposed in a row direction or a column direction.

According to another aspect of the present disclosure, the plurality of first LEDs may be disposed in a plurality of first rows of the display panel, the plurality of second LEDs may be disposed in a plurality of second rows between the plurality of first rows, intervals between the plurality of first LEDs disposed in the same first row may not be constant, and intervals between the plurality of second LEDs disposed in the same second row may not be constant.

It will be apparent to those skilled in the art that various modifications and variations can be made in the display device and the method of manufacturing the same of the present disclosure without departing from the technical idea or scope of the disclosure. Thus, it is intended that the present disclosure cover the modifications and variations of this disclosure provided they come within the scope of the appended claims and their equivalents.

What is claimed is:

1. A method of manufacturing a display device, comprising:
   a first transferring step of transferring a plurality of LEDs disposed on a wafer onto a plurality of donors; and
   a second transferring step of transferring the plurality of LEDs transferred onto the plurality of donors onto a display panel,
   wherein in the second transferring step, an area where one of the plurality of donors overlaps the display panel partially overlaps an area where the other one of the plurality of donors overlaps the display panel,
   wherein a plurality of first LEDs among the plurality of LEDs disposed on the wafer and a plurality of second LEDs among the plurality of LEDs disposed on the wafer are disposed in different rows or different columns on the wafer.

2. The method according to claim 1, wherein the plurality of donors includes a first donor and a second donor, and
   wherein the first transferring step includes:
   transferring the plurality of first LEDs disposed on the wafer onto the first donor; and
   transferring the plurality of second LEDs disposed on the wafer onto the second donor.

3. The method according to claim 2, wherein the plurality of first LEDs and the plurality of second LEDs are alternately disposed in the same row and alternately disposed in the same column, on the wafer.

4. The method according to claim 2, wherein the second transferring step includes:
   transferring the plurality of first LEDs of the first donor in a plurality of first areas of the display panel; and
   transferring the plurality of second LEDs of the second donor in a plurality of second areas of the display panel, and
   the first area and the second area partially overlap.

5. The method according to claim 4, wherein the plurality of first LEDs is disposed in a plurality of rows in the display panel, and
   wherein the transferring of the plurality of second LEDs of the second donor includes transferring the plurality of second LEDs in a space between the plurality of rows.

6. The method according to claim 4, wherein the plurality of first LEDs is disposed in a plurality of columns in the display panel, and
   wherein the transferring of the plurality of second LEDs of the second donor includes transferring the plurality of second LEDs in a space between the plurality of columns.

7. The method according to claim 4, wherein the transferring of the plurality of second LEDs of the second donor includes: transferring the plurality of second LEDs such that the plurality of first LEDs and the plurality of second LEDs are alternately disposed both in a row direction and a column direction.

8. A method of manufacturing a display device, comprising:

transferring some of a plurality of LEDs disposed on a first wafer onto a first donor;
transferring the other of the plurality of LEDs disposed in the first wafer or some of the plurality of LEDs disposed on a second wafer onto a second donor;
transferring the plurality of LEDs transferred onto the first donor in a first area of a display panel; and
transferring the plurality of LEDs transferred onto the second donor in a second area of the display panel,
wherein the first area and the second area at least partially overlap each other to improve color uniformity between the plurality of LEDs,
wherein the transferring onto a first donor includes: transferring a plurality of alignment keys disposed on the first wafer onto the first donor, and
wherein the transferring onto a second donor includes: transferring the plurality of alignment keys disposed on the first wafer or the second wafer onto the second donor.

9. The method according to claim 8, wherein the transferring onto a first donor includes: transferring a plurality of LEDs disposed in odd-numbered lines or even-numbered lines among the plurality of LEDs disposed in the first wafer onto the first donor, and
wherein the transferring onto a second donor includes: transferring a plurality of LEDs disposed in a different line from the line transferred onto the first donor among the plurality of LEDs disposed on the first wafer or a plurality of LEDs disposed in odd-numbered lines or even-numbered lines among the plurality of LEDs disposed in the second wafer onto the second donor.

10. The method according to claim 9, wherein the plurality of LEDs is disposed in odd-numbered lines or even-numbered lines in the first area, and
wherein the transferring in a second area includes: transferring the plurality of LEDs of the second donor in at least partial space of a space between the odd-numbered lines or at least partial space of a space between the even-numbered lines.

11. The method according to claim 8, wherein the transferring onto a first donor includes: transferring a plurality of LEDs which forms a mosaic pattern among the plurality of LEDs disposed in the first wafer onto the first donor, and
wherein the transferring onto a second donor includes: transferring a plurality of LEDs which forms a different mosaic pattern from the pattern transferred onto the first donor among the plurality of LEDs disposed on the first wafer or a plurality of LEDs which forms a mosaic pattern among the plurality of LEDs disposed on the second wafer onto the second donor.

12. The method according to claim 11, wherein the plurality of LEDs is disposed in the first area to form a mosaic pattern, and
wherein the transferring onto a second area includes: transferring the plurality of LEDs of the second donor in a space between the mosaic patterns.

13. The method according to claim 8, wherein the transferring in a first area includes: transferring the plurality of alignment keys disposed in the first donor in the first area,
wherein the transferring in a second area includes: transferring the plurality of alignment keys disposed in the second donor in the second area, and
wherein the plurality of alignment keys transferred from the first donor in the first area does not overlap the plurality of alignment keys transferred from the second donor in the second area.

14. The method according to claim 8, wherein at least a part of at least two sides of the first area overlaps two sides of the second area.

15. The method according to claim 8, wherein one corner of the first area is disposed in the second area.

* * * * *